(12) United States Patent
Sung et al.

(10) Patent No.: US 11,508,789 B2
(45) Date of Patent: Nov. 22, 2022

(54) DISPLAY DEVICE AND METHOD OF MANUFACTURING THE SAME

(71) Applicant: SAMSUNG DISPLAY CO., LTD., Yongin-si (KR)

(72) Inventors: Woo Yong Sung, Seoul (KR); Junghan Seo, Hwaseong-si (KR); Seungyong Song, Suwon-si (KR); Sehoon Jeong, Suwon-si (KR); Seung-Yeon Chae, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/155,785

(22) Filed: Jan. 22, 2021

(65) Prior Publication Data
US 2021/0366999 A1 Nov. 25, 2021

(30) Foreign Application Priority Data
May 20, 2020 (KR) .......................... 10-2020-0060577

(51) Int. Cl.
*H01L 27/32* (2006.01)
*H01L 51/00* (2006.01)
(Continued)

(52) U.S. Cl.
CPC .......... *H01L 27/323* (2013.01); *G06F 3/0412* (2013.01); *G06F 3/0445* (2019.05);
(Continued)

(58) Field of Classification Search
CPC .............. H01L 27/323; H01L 27/3246; H01L 51/0097; H01L 51/5253; H01L 51/56; G06F 3/0412; G06F 3/0445
(Continued)

(56) References Cited

U.S. PATENT DOCUMENTS 7,133,032 B2 11/2006 Cok
7,202,856 B2 4/2007 Cok
(Continued)

FOREIGN PATENT DOCUMENTS

CN 109860422 6/2019
JP 2018-088346 6/2018
(Continued)

*Primary Examiner* — Prabodh M Dharia
(74) *Attorney, Agent, or Firm* — F. Chau & Associates, LLC

(57) ABSTRACT

The present disclosure provides a display device with a display panel, an input sensing unit, and a protective member. The input sensing unit is disposed on the display panel. The protective member includes an insulating material and is disposed on the input sensing unit. The protective member includes a first protective portion and a second protective portion disposed on the first protective portion, where a first modulus of the first protective portion is greater than a second modulus of the second protective portion. The second protective portion with the lower modulus absorbs external impacts, and the first protective portion with the higher modulus disperses the absorbed impact and prevents the display panel from being deformed by an external force. Therefore, the impact resistance of the display device is improved.

20 Claims, 20 Drawing Sheets

(51) Int. Cl.
*H01L 51/52* (2006.01)
*H01L 51/56* (2006.01)
*G06F 3/044* (2006.01)
*G06F 3/041* (2006.01)

(52) U.S. Cl.
CPC ...... *H01L 27/3246* (2013.01); *H01L 51/0097* (2013.01); *H01L 51/5253* (2013.01); *H01L 51/56* (2013.01); *G06F 3/0446* (2019.05); *G06F 2203/04102* (2013.01); *G06F 2203/04103* (2013.01); *H01L 2227/323* (2013.01); *H01L 2251/5338* (2013.01)

(58) Field of Classification Search
USPC .................. 345/174; 313/567; 430/281.1
See application file for complete search history.

(56) References Cited

U.S. PATENT DOCUMENTS

| | | | |
|---|---|---|---|
| 8,963,886 B2 | 2/2015 | Wassvik | |
| 9,158,396 B2 | 10/2015 | Choi | |
| 10,572,041 B2 | 2/2020 | Lee et al. | |
| 2007/0216302 A1* | 9/2007 | Hashimoto | H01J 11/12 313/567 |
| 2011/0267307 A1 | 11/2011 | Kim et al. | |
| 2012/0237873 A1* | 9/2012 | Fujiwara | C09D 183/06 430/281.1 |
| 2015/0155520 A1* | 6/2015 | Kim | H01L 27/3276 257/40 |
| 2015/0338977 A1* | 11/2015 | Matsumoto | G06F 3/0443 29/850 |
| 2016/0237281 A1 | 8/2016 | Miyamoto et al. | |
| 2017/0170210 A1* | 6/2017 | Yan | H01L 27/3258 |
| 2017/0263890 A1* | 9/2017 | Chun | H01L 51/0097 |
| 2017/0352834 A1* | 12/2017 | Kim | H01L 51/5253 |
| 2018/0004254 A1* | 1/2018 | Park | G06F 1/1656 |
| 2018/0151837 A1 | 5/2018 | Furuie | |
| 2019/0004361 A1* | 1/2019 | Oka | G02F 1/13338 |
| 2019/0073001 A1* | 3/2019 | Kim | G04G 21/08 |
| 2020/0061967 A1* | 2/2020 | Cho | C08J 7/046 |
| 2020/0185641 A1* | 6/2020 | Jeong | H01L 51/0097 |
| 2020/0251682 A1 | 8/2020 | Guo et al. | |

FOREIGN PATENT DOCUMENTS

| | | |
|---|---|---|
| KR | 10-1067164 | 9/2011 |
| KR | 10-2014-0125932 | 10/2014 |
| KR | 10-2016-0064082 | 6/2016 |
| KR | 10-1756656 | 7/2017 |
| KR | 10-1787553 | 10/2017 |
| KR | 10-1811424 | 12/2017 |
| KR | 10-2020-0001881 | 1/2020 |

* cited by examiner

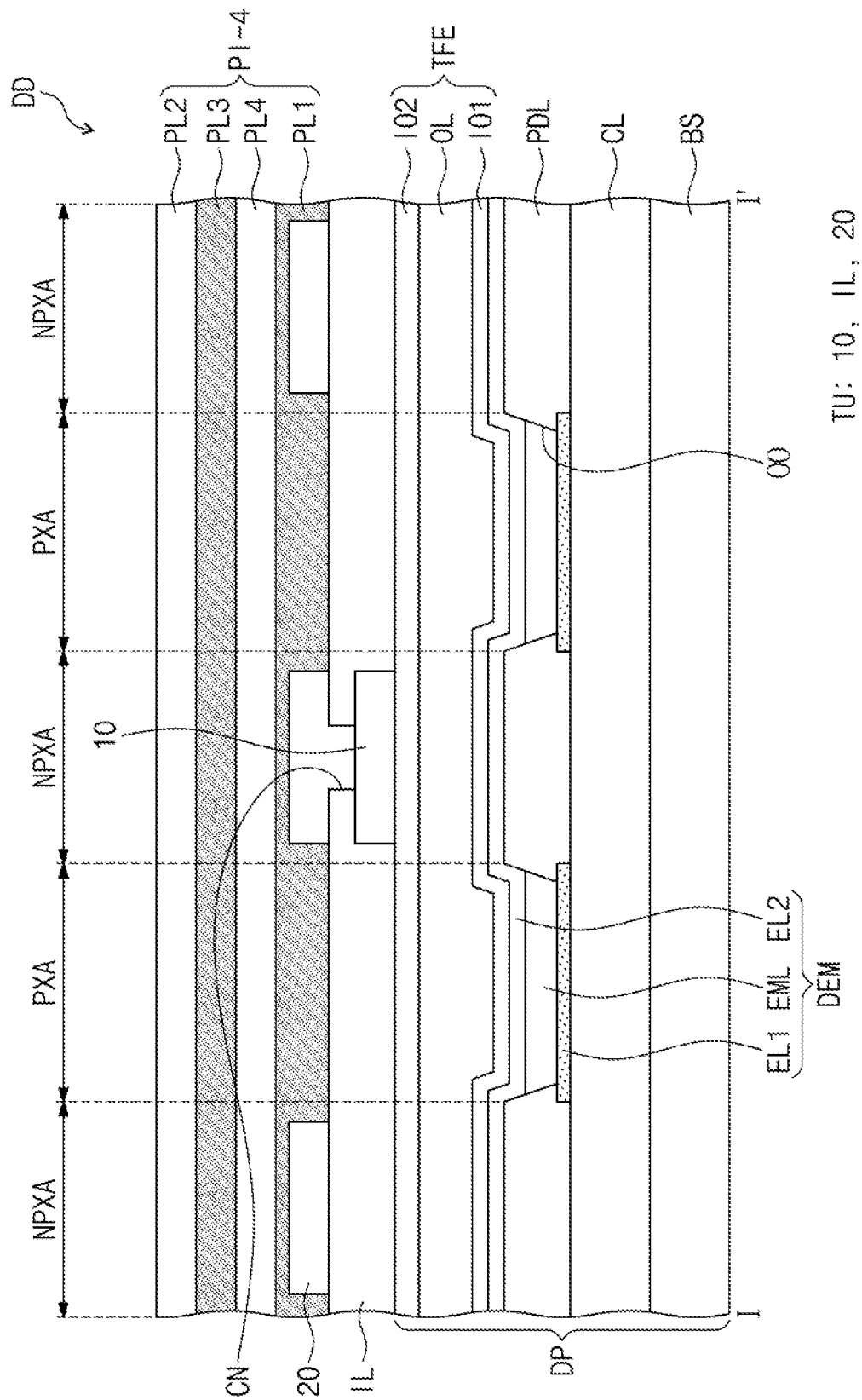

FIG. 10
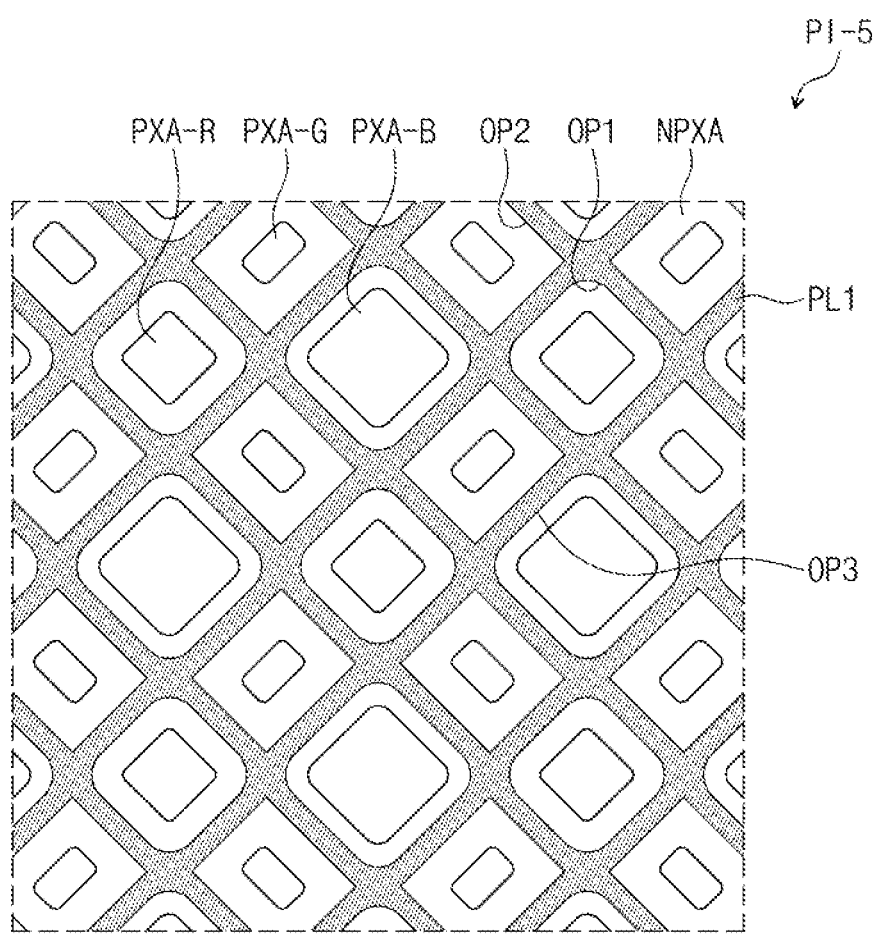
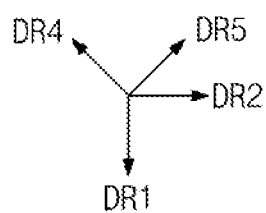

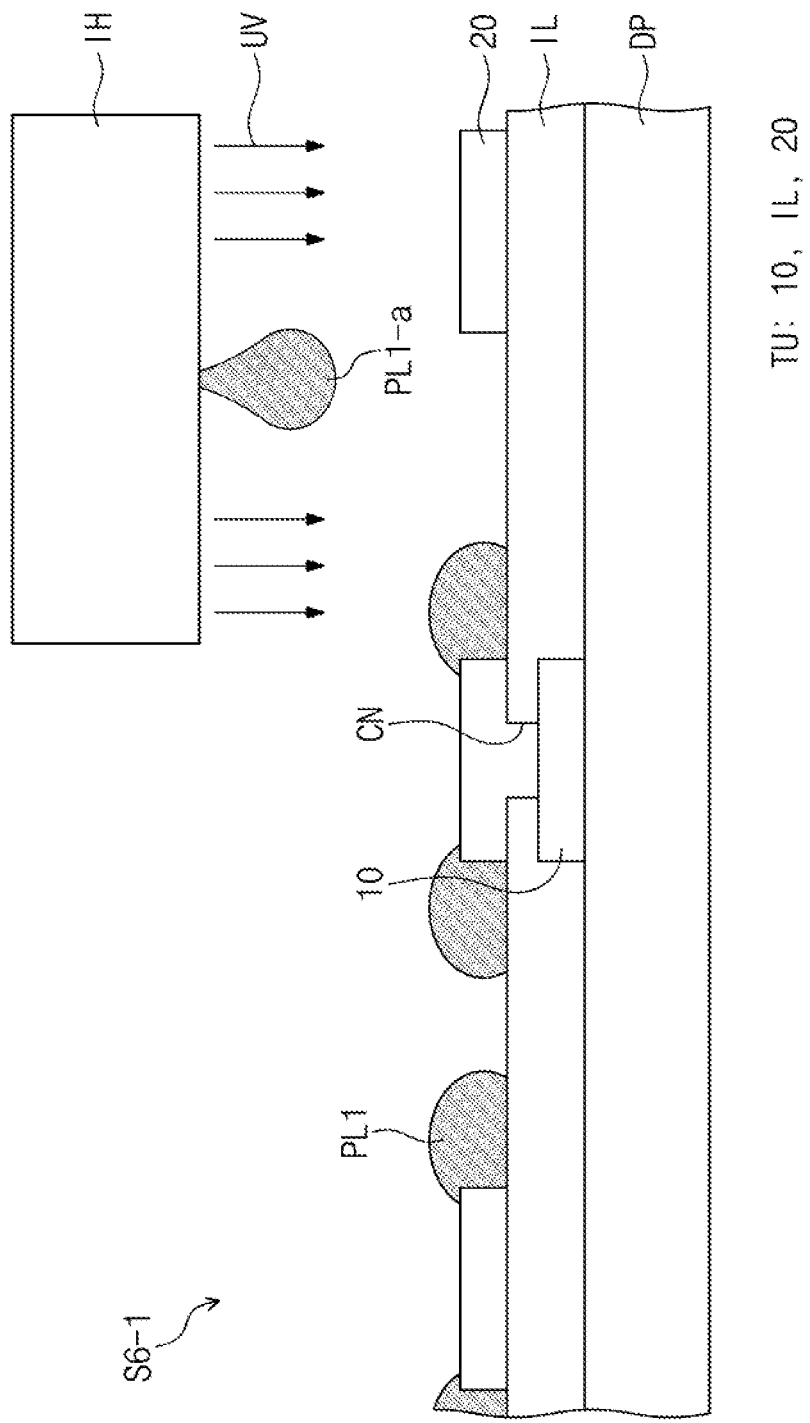

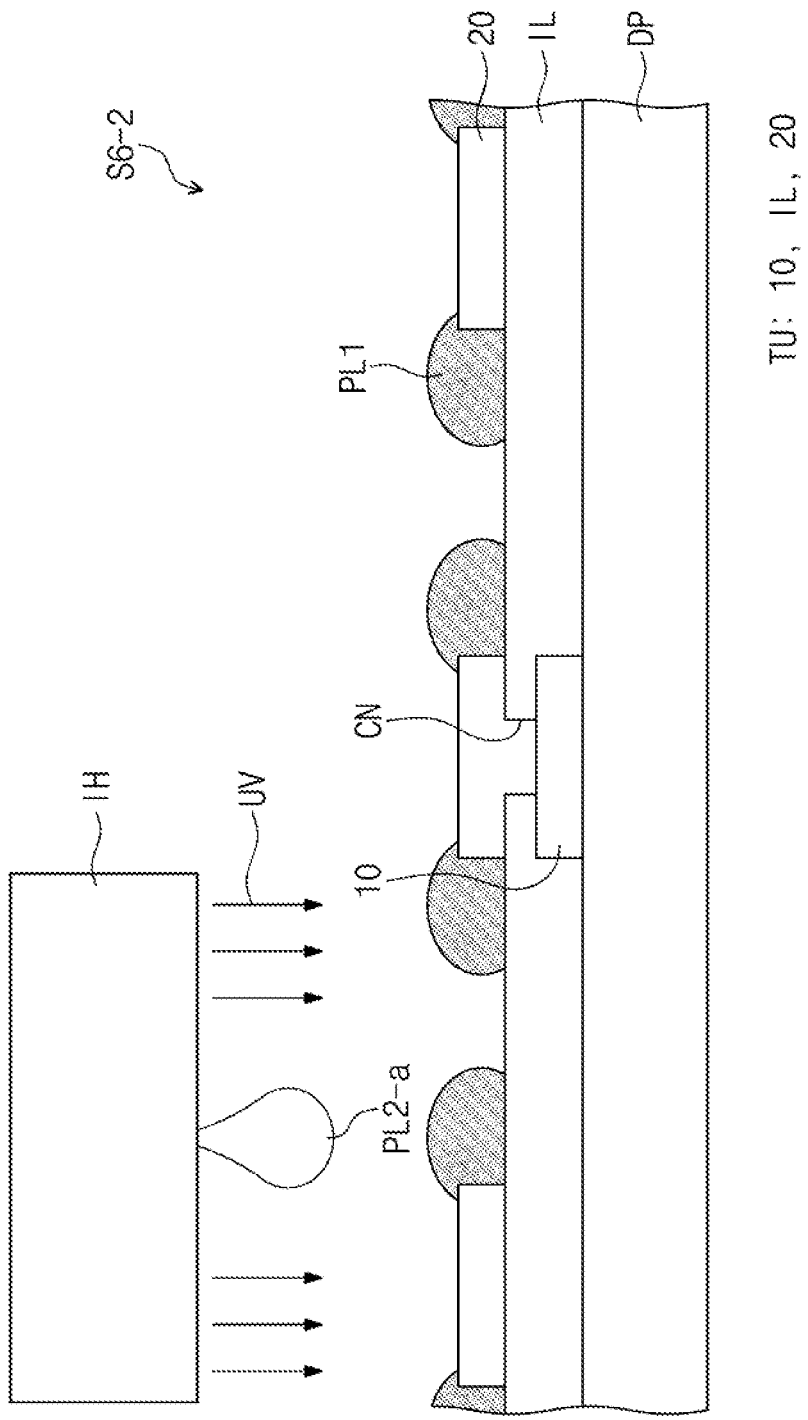

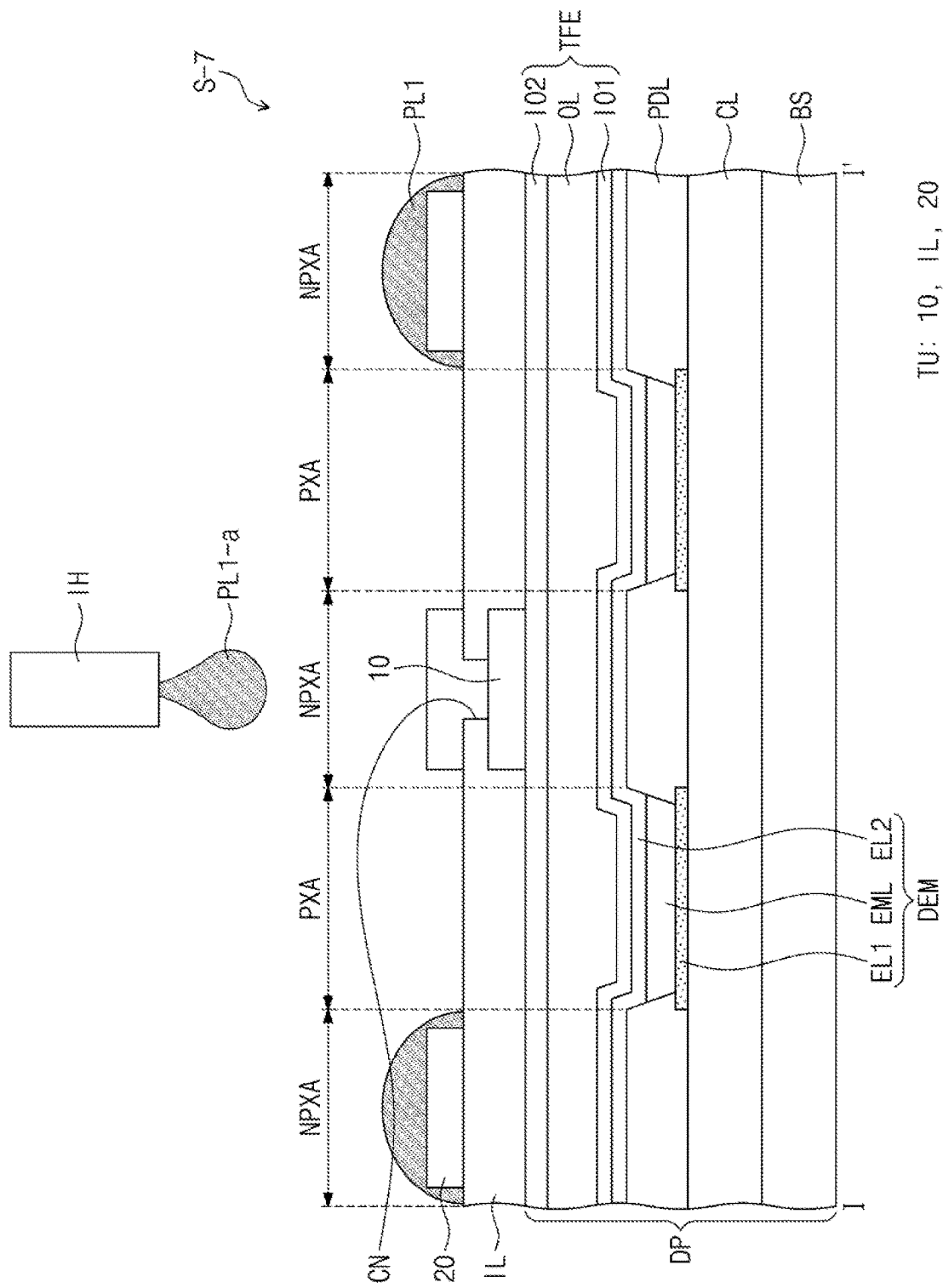

DISPLAY DEVICE AND METHOD OF MANUFACTURING THE SAME

CROSS-REFERENCE TO RELATED APPLICATION

This U.S. non-provisional patent application claims priority under 35 U.S.C. § 119 of Korean Patent Application No. 10-2020-0060577, filed on May 20, 2020, the contents of which are incorporated by reference herein in their entirety.

BACKGROUND

1. Field of Disclosure

The present disclosure relates to a display device and a method of manufacturing the same. More particularly, the present disclosure relates to a display device with improved impact resistance and a method of manufacturing the display device.

2. Description of the Related Art

Display devices are devices used to convey information to a user from an electronic device such as a television, mobile phone, or computer. Display devices have a display panel to display an image to a user. Some display devices include a touch panel capable of sensing user inputs that are applied to the display device.

Foldable or bendable display devices include a display area with a display panel that can fold. Along with a folding display, an external shell (e.g., a non-display area enclosing a display area) may also fold. Foldable or bendable display devices allow the user a level of convenience, where the foldable or bendable display device may be more easily stored or protected by the external shell.

Although foldable or bendable display devices may be protected by their external shell when closed, the display itself may have inherent structural weaknesses (e.g., reduced mechanical strength) to accommodate the ability to bend or fold. When an impact is applied to such a display device (e.g., via user input on a touch panel, via the device being dropped, etc.), structural weakness can lead to cracks or breakage, which in some cases may render the device unusable. Therefore, there is a need in the art to improve the strength of display devices.

SUMMARY

The present disclosure provides a display device having improved impact resistance, as well as a method of manufacturing the display device.

Embodiments of the inventive concept provide a display device including a display panel, an input sensing unit disposed on the display panel, and a protective member disposed on the input sensing unit, wherein the protective member includes an insulating material. The protective member includes a first protective portion having a first modulus and a second protective portion having a second modulus, wherein the second protective portion is disposed on the first protective portion and the first modulus is greater than the second modulus.

In some embodiments, the first protective portion includes a stripe pattern. In some embodiments, the first protective portion includes a mesh pattern. In some embodiments, the first protective portion includes an integral shape that covers an upper surface of the input sensing unit.

In some embodiments, the protective member further includes a third protective portion with a third modulus, wherein the third protective portion is disposed between the first protective portion and the second protective portion, and wherein the third modulus is greater than the second modulus. In some embodiments, the third protective portion includes a pattern shape with a plurality of arranged bars.

In some embodiments, the protective member further includes a fourth protective portion with a fourth modulus, wherein the fourth protective portion is disposed between the first protective portion and the third protective portion, and wherein the fourth modulus is less than the first modulus and the third modulus.

In some embodiments, the display panel includes a base layer, a circuit layer disposed on the base layer, an encapsulation layer disposed on the circuit layer, a pixel definition layer disposed between the circuit layer and the encapsulation layer, wherein the pixel definition layer includes an opening, and a light-emitting layer disposed in the opening, wherein the first protective portion overlaps at least a portion of the pixel definition layer or the light-emitting layer.

In some embodiments, the first protective portion does not overlap the light-emitting layer and the first protective portion includes a light-blocking material.

In some embodiments, the input sensing unit includes a first conductive layer disposed directly on the encapsulation layer, a second conductive layer disposed on the first conductive layer, and an insulating layer disposed between the first conductive layer and the second conductive layer.

In some embodiments, each of the first protective portion and the second protective portion includes an ultraviolet-curable resin. In some embodiments, the first protective portion includes an organic material including inorganic particles, and each of the inorganic particles has a diameter equal to or less than 10 micrometers. In some embodiments, the first protective portion includes graphene. In some embodiments, the second modulus is equal to or greater than 0.1 MPa and the second modulus is equal to or less than 5 GPa. In some embodiments, the display panel is flexible.

Embodiments of the inventive concept provide a method of manufacturing a display device. The method includes providing a display panel including a light-emitting area and a non-light-emitting area, providing an input sensing unit on the display panel, forming a first protective portion having a first modulus on the input sensing unit, and forming a second protective portion having a second modulus on the first protective portion. The first modulus is greater than the second modulus.

In some embodiments, the forming of the first protective portion or the forming of the second protective portion includes an inkjet printing process and a process of irradiating an ultraviolet light. In some embodiments, the inkjet printing process and the process of irradiating the ultraviolet light are performed substantially simultaneously. In some embodiments, the forming of the first protective portion includes forming a pattern that overlaps at least a portion of the light-emitting area and the non-light-emitting area. In some embodiments, the forming of the first protective portion includes forming a pattern that does not overlap the light-emitting area.

According to the above, the display device may include the protective portions having different modulus from each other (e.g., where a first protective portion has a modulus greater than a second protective portion). Therefore, the impact resistance of the display device may be improved.

In addition, according to the manufacturing method of the display device, the display device including the protective portions having different modulus from each other may be manufactured.

Embodiments of the inventive concept include an display device comprising a flexible display panel, a first protective layer disposed on the display panel, wherein the first protective layer has a first elastic modulus, and a second protective layer disposed on the first protective layer, wherein the second protective layer has a second elastic modulus that is lower than the first elastic modulus.

BRIEF DESCRIPTION OF THE DRAWINGS

The above and other advantages of the present disclosure will become readily apparent by reference to the following detailed description when considered in conjunction with the accompanying drawings wherein:

FIG. 6 is a cross-sectional view showing a display device according to an embodiment of the present disclosure;

FIG. 10 is a plan view showing a protective member according to an embodiment of the present disclosure;

FIG. 12A is a cross-sectional view showing a process of a method of manufacturing a display device according to an embodiment of the present disclosure;

FIG. 12B is a cross-sectional view showing a process of the method of manufacturing the display device according to an embodiment of the present disclosure; and FIG. 13 is a cross-sectional view showing a process of a method of manufacturing a display device according to an embodiment of the present disclosure.

DETAILED DESCRIPTION

Figure 1A:
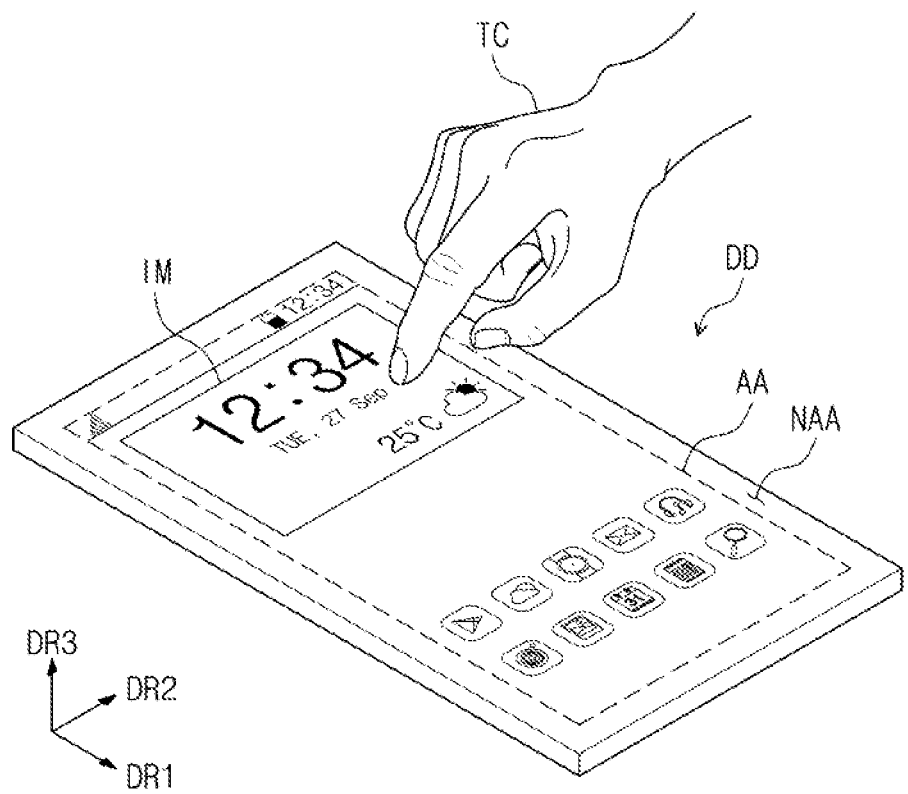
FIG. 1A is a perspective view showing a display device according to an embodiment of the present disclosure.

Electronic devices such as televisions, mobile phones, computers, tablets, etc. may include a display device (e.g., a display unit, a display panel) to convey visual information to a user such as text information, video information, picture information, two-dimensional or three-dimensional images, or the like. A folding display device provides an ability to bend or fold the display for a more portable electronic device. However, a folding display device may have reduced (e.g., relatively weak) mechanical strength in order to enable such bending and folding of the display. For instance, certain manufacturing processes and lightweight materials used for foldable or bendable display devices to accommodate the folding or bending feature may result in increased susceptibility to damage (e.g., as the lightweight materials may be inherently weaker). Reduced mechanical strength may result in damage to the display, provide an unusable display device, reduce the efficacy or feasibility of certain features (e.g., such as touchscreen features), etc.

Embodiments of the present disclosure provide a display device with improved impact resistance, as well as a method of manufacturing such a display device. In some embodiments, a display device includes a protective member. The protective member includes a first protective portion and a second protective portion, wherein the first protective portion has a first modulus greater than a second modulus of the second protective portion. The first protective portion with the relatively higher modulus may be disposed on an input sensing unit (e.g., a touch unit) of the display device and the second protective portion with the relatively lower modulus may be disposed on the first protective portion. In various embodiments of the present disclosure, the modulus of each of the first protective portion and the second protective portion may be determined depending on a type, a structure, and a density of material included in each of the protective portions. Further, as described herein, the first protective portion with the relatively higher modulus may have a stripe pattern, a mesh pattern, an integral shape that covers an upper surface of the input sensing unit, etc.

Accordingly, the second protective portion with the low modulus is capable of absorbing external impacts, while the first protective portion (e.g., the high modulus protective portion underlying the low modulus protective portion) is capable of dispersing the absorbed impact over a larger area, thereby improving impact resistance of the display device. That is, the protective portion with the low modulus absorbs external impacts, and the protective portion with the high modulus disperses the absorbed external impact and prevents the display panel from being deformed by an external force. Therefore, the protection of the display device and the impact resistance of the display device is improved.

The present disclosure may be variously modified and realized in many different forms. Therefore, specific embodiments will be exemplified in the drawings and described in detail herein. However, the present disclosure should not be limited to the specific disclosed forms. The present disclosure should be construed to include all modifications, equivalents, or replacements included in the spirit and scope of the present disclosure.

In the present disclosure, it will be understood that when an element or layer is referred to as being "on", "connected to," or "coupled to" another element or layer, the element or layer can be directly on, connected or coupled to the other element or layer or intervening elements or layers may be present.

Like numerals refer to like elements throughout. In the drawings, the thickness, ratio, and dimension of components are exaggerated for an effective description of the technical content.

As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Therefore, a first element, component, region, layer or section discussed below could be termed a second element, component, region, layer or section without departing from the teachings of the present disclosure. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another element(s) or feature(s) as shown in the figures.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as with a meaning consistent with that term's meaning in the context of the relevant art and will not be interpreted in an idealized or overly formal sense unless expressly so defined herein.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

A display device and a method of manufacturing the display device according to the present disclosure are explained in detail herein, with reference to the accompanying drawings.

Figure 1B:
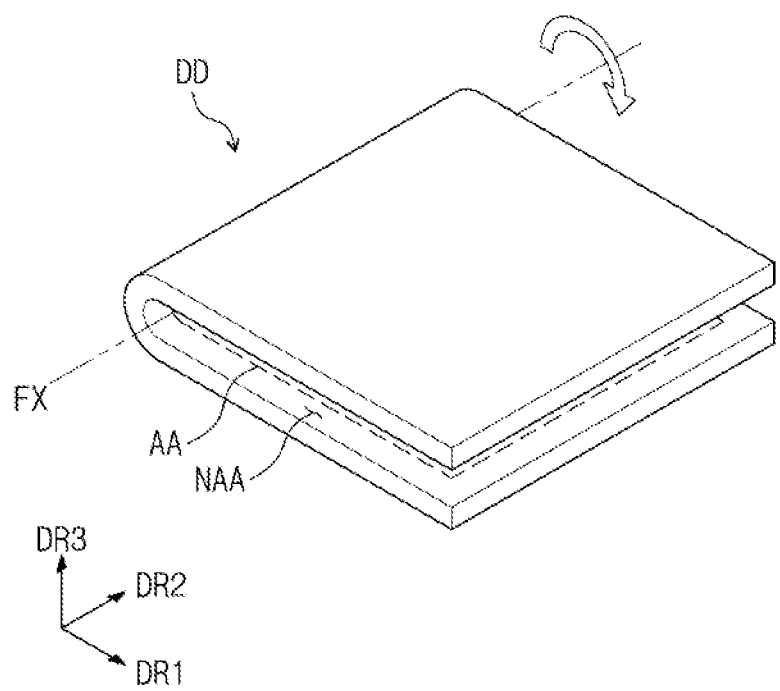
FIG. 1B is a perspective view showing a folding state of the display device shown in FIG. 1A.
Figure 1C:
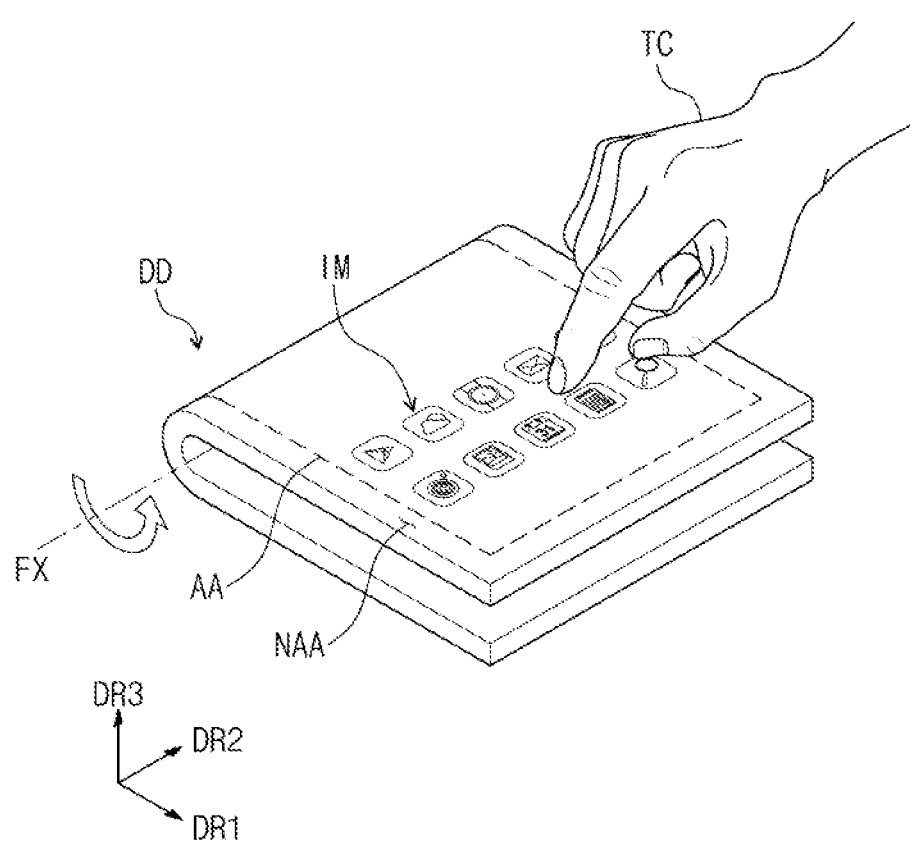
FIG. 1C is a perspective view showing a folding state of the display device shown in FIG. 1A.

FIG. 1A is a perspective view showing a display device DD according to an embodiment of the present disclosure. FIGS. 1B and 1C are perspective views showing a folding state of the display device DD shown in FIG. 1A. The display device DD, according to the embodiment of the present disclosure, will be described in detail with reference to FIGS. 1A to 1C.

The display device DD may be a device that is activated in response to electrical signals. For example, the display device DD may be included in, or applied to, a mobile device, a computer, a notebook computer, a tablet computer, a television set, or the like. In the present embodiment, a mobile device such as a smartphone is described as a representative example of the display device DD.

In some examples, a display device DD may include or refer to a user interface that may enable a user to interact with a device (e.g., an electronic device). In some embodiments, the display device DD may include a display screen, or an input device (e.g., remote control device interfaced with the user interface directly or through an input/output (I/O) controller module). In some cases, an I/O controller may be implemented as part of a processor. In some cases, a user may interact with a device via an I/O controller or via hardware components controlled by an I/O controller. In some cases, a user interface may be a graphical user interface (GUI).

The display device DD may display an image IM in a third direction DR3 on a display surface parallel to each of a first direction and second direction DR1 and DR2, the display surface on which the image IM is displayed may correspond to a front surface of the display device DD.

In the present embodiment, an upper (or front) and a lower (or rear) surfaces of each member are defined with respect to a direction in which the image IM is displayed. The front and rear surfaces are opposite to each other in the third direction DR3. A normal line direction of each of the front and lower surfaces may be substantially parallel to the third direction DR3. A separation distance between the front and rear surfaces in the third direction DR3 may correspond to a thickness in the third direction DR3 of the display device DD.

Directions indicated by the first, second, and third directions DR1, DR2, and DR3 may be relative to each other and may be changed to other directions. Hereinafter, the first, second, and third directions respectively correspond to directions indicated by each of the first, second, and third direction axes DR1, DR2, and DR3 and are assigned with the same reference numerals as those of the first, second, and third directions DR1, DR2, and DR3.

The display device DD may include an active area AA and a peripheral area NAA in a plane. The image IM may be displayed through the active area AA. The image IM may include a still image or a moving image. FIGS. 1A and 1C show a plurality of application icons and a clock widget as representative examples of the image IM.

The active area AA through which the image IM is displayed may have a quadrangular shape. The peripheral area NAA may surround the active area AA. However, this is merely exemplary, and the active area AA and the peripheral area NAA may be designed in different shapes.

The display device DD may sense an external input TC applied thereto from the outside. The external input TC may include inputs of various forms applied thereto from the outside, such as a part of a user's body, light, heat, or pressure. Additionally, or alternatively, the display device DD may sense the external input TC approaching close thereto or adjacent thereto in addition to the external input TC that may be in contact with the display device DD.

FIGS. 1A and 1C show a user's hand as the external input TC. However, this is merely exemplary, the display device DD, according to the embodiment of the present disclosure, may sense various touch events, and forms of the external input TC should not be particularly limited.

The active area AA included in the display device DD may be an area in which the external input TC is sensed. A plurality of sensing electrodes may be arranged in the active area AA to sense the external input TC.

The display device DD may be flexible or have flexible properties, and the display device DD may be fully bent or may be bent in the scale of a few nanometers. For example, the display device DD may be a curved electronic device or a foldable electronic device. However, the display device DD should not be limited thereto or thereby, and the display device DD may be rigid according to embodiments.

FIGS. 1B and 1C show a flexible display device as the display device DD. As shown in FIGS. 1B and 1C, the display device DD may be folded about a folding axis FX in various directions.

Referring to FIG. 1B, the display device DD may be deformed into an in-folding state. The display device DD may be folded to surround the active area AA in the in-folding state. Accordingly, the active area AA may not be exposed to the outside and may be prevented from the outside.

Referring to FIG. 1C, the display device DD may be deformed into an out-folding state. At least a portion of the active area AA of the display device DD may be exposed to the outside in the third direction DR3 in the out-folding state. Accordingly, the display device DD may sense the external input TC in the out-folding state.

An area deformed when the display device DD is folded may be defined as a folding area of the display device DD. Referring to FIGS. 1B and 1C, the display device DD may be inwardly folded (in-folding) or outwardly folded (out-folding) with respect to one folding area. However, the number of folding areas in the display device DD should not be limited thereto or thereby, and the display device DD may include two or more folding areas.

The display device DD may have a flexibility to be changed into a variety of shapes due to a force provided from the outside. Accordingly, various use environments may be provided to the user through changes in shape during the use of the display device DD.

Figure 2:
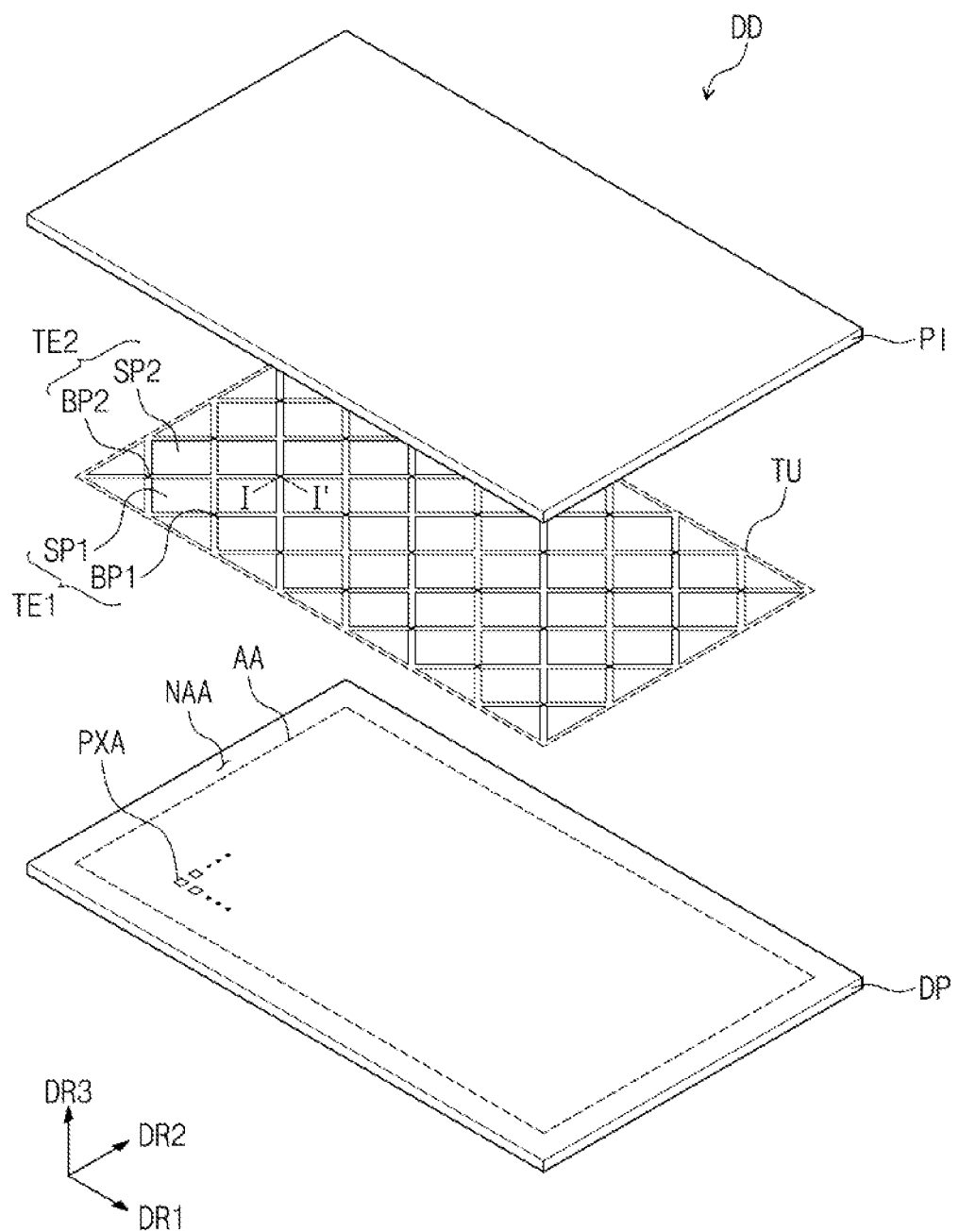
FIG. 2 is an exploded perspective view showing a display device according to an embodiment of the present disclosure.

FIG. 2 is an exploded perspective view showing the display device DD according to an embodiment of the present disclosure. Referring to FIG. 2, the display device DD may include a display panel DP, an input sensing unit TU, and a protective member PI. The input sensing unit TU may be disposed on the display panel DP. The protective member PI may be disposed on the input sensing unit TU.

The active area AA may include a plurality of light-emitting areas PXA displaying lights. The active area AA may display the image IM corresponding to the lights. The light-emitting areas PXA may be arranged in the active area AA to be spaced apart from each other. Pixels may be respectively disposed in the light-emitting areas PXA. The pixels may display the lights in response to electrical signals.

The display panel DP according to an embodiment of the present disclosure may be a light-emitting type display panel. For instance, the display panel DP may be an organic light-emitting display panel or a quantum dot light-emitting display panel. However, the display panel DP should not be limited thereto or thereby. Hereinafter, the organic light-emitting display panel will be described as the display panel DP.

The display panel DP may include a pad area (not shown) electrically connected to an external device. The display panel DP may be connected to a printed circuit board, a flexible circuit board, or the like through the pad area (not shown).

The pad area (not shown) included in the display panel DP may be provided in a single or plural number. Additionally, or alternatively, the pad areas may be formed in different layers from each other or may be formed in the same layer as each other.

The input sensing unit TU may be disposed on the display panel DP. The input sensing unit TU may sense the external input TC and may obtain information about position and intensity of the external input TC. For instance, an input sensing unit TU may include a fingerprint sensor, a touch sensor, an I/O controller, etc. In some cases, an input sensing unit TU may include a touch-screen digitizer overlaid onto the display that can sense touch and interact with the display. In some examples, an input sensing unit TU may be used to collect input from a user, to provide a secure process to access the display device, etc.

In some examples, an input sensing unit TU may be coupled with a processor which may analyze collected ultrasonic signals reflected from the fingerprint of a user. For instance, A processor is an intelligent hardware device, (e.g., a general-purpose processing component, a digital signal processor (DSP), a central processing unit (CPU), a graphics processing unit (GPU), a microcontroller, an application specific integrated circuit (ASIC), a field programmable gate array (FPGA), a programmable logic device, a discrete gate or transistor logic component, a discrete hardware component, or any combination thereof). In some cases, the processor is configured to execute computer-readable instructions stored in a memory to perform various functions (e.g., such as analyze reflected ultrasonic signals, compare fingerprints, perform device unlocking operations, etc.). In some embodiments, a processor includes special purpose components for modem processing, baseband processing, digital signal processing, or transmission processing.

For instance, in some examples, the techniques described herein may be implemented in haptic feedback systems that interact with a user's sense of touch by applying mechanical forces, vibrations, or motions. Haptic stimulation can be used to create or interact with virtual objects in a computer simulation, and to enhance the remote control of machines and devices. Haptic devices may incorporate tactile sensors that measure forces exerted by the user on the interface. According to the techniques described herein, such devices may incorporate sensors (e.g., an input sensing unit TU) on flexible or bendable display areas.

The input sensing unit TU may include sensing electrodes TE1 and TE2. The sensing electrodes TE1 and TE2 may be disposed in the active area AA. The sensing electrodes TE1 and TE2 may include a first sensing electrode TE1 and a second sensing electrode TE2. Although not shown in figures, the input sensing unit TU may include a plurality of signal lines and a plurality of pads.

The first sensing electrode TE1 may extend in the first direction DR1. The first sensing electrode TE1 may be provided in plural and may be arranged in the second direction DR2 to be spaced apart from each other. The first sensing electrode TE1 may include a plurality of first sensing patterns SP1 and a plurality of first connection patterns BP1. The plurality of first sensing patterns SP1 and the plurality of first connection patterns BP1 may be arranged in the first direction DR1. The first sensing patterns SP1 may be alternately arranged with the first connection patterns BP1 in the first direction DR1. Each of the first connection patterns BP1 may connect two first sensing patterns adjacent to each other among the first sensing patterns SP1.

The second sensing electrode TE2 may extend in the second direction DR2. The second sensing electrode TE2 may be provided in plural, and the second sensing electrodes TE2 may be arranged in the first direction DR1 to be spaced apart from each other. The second sensing electrode TE2 may include a plurality of second sensing patterns SP2 and a plurality of second connection patterns BP2. The plurality of second sensing patterns SP2 and the plurality of second connection patterns BP2 may be arranged in the second direction DR2. The second sensing patterns SP2 may be alternately arranged with the second connection patterns BP2 in the second direction DR2. Each of the second connection patterns BP2 may connect two second sensing patterns adjacent to each other among the second sensing patterns SP2.

The first connection patterns BP1 and the second connection patterns BP2 may be disposed on different layers from each other, and the first sensing patterns SP1 and the second sensing patterns SP2 may be disposed on the same layer. For example, the first connection patterns BP1 may be disposed on a layer different from a layer on which the second connection patterns BP2, the first sensing patterns SP1, and the second sensing patterns SP2 are disposed. Additionally, or alternatively, the second connection patterns BP2, the first sensing patterns SP1, and the second sensing patterns SP2 may be disposed on the same layer.

However, this is merely exemplary. For example, the first connection patterns BP1 may be disposed on the first sensing patterns SP1 and the second sensing patterns SP2, or the first sensing electrode TE1 and the second sensing electrode TE2 may be disposed on different layers from each other. However, the first connection patterns BP1, the first sensing electrode TE1, and the second sensing electrode TE2 should not be limited thereto or thereby.

The input sensing unit TU may be driven using a mutual capacitance method. For example, the first sensing electrode TE1 and the second sensing electrode TE2 may receive electrical signals different from each other, and the input sensing unit TU may obtain information about the external input TC based on a variation in capacitance between the first sensing electrode TE1 and the second sensing electrode TE2. However, this is merely exemplary, and the input sensing unit TU may be driven in various methods, such as a self-capacitance method or a resistance method. As a result, the input sensing unit TU should not be particularly limited.

The signal lines (not shown) may be disposed in the peripheral area NAA of the display device DD. Accordingly, the signal lines (not shown) may not be viewed from the outside. Each of the signal lines (not shown) may be connected to the sensing electrodes in various ways.

The pads (not shown) may be connected to the signal lines (not shown) and then may be electrically connected to the sensing electrodes TE1 and TE2. External terminals provided through the circuit board or the like may be connected to the pads (not shown) and may electrically connect the input sensing unit TU to external components.

The protective member PI may be disposed on the input sensing unit TU. The protective member PI may cover an upper surface of the input sensing unit TU. The protective member PI may have an insulating property. For example, the protective member PI may include an organic material.

The protective member PI may absorb and disperse impacts applied to the display device DD. The protective member PI may improve impact resistance of the display device DD. Accordingly, the protective member PI may protect the display panel DP and the input sensing unit TU disposed thereunder. Details on the protective member PI of the display device DD will be described later.

The display device DD may further include an anti-reflective unit and a window, which are disposed on the protective member PI.

The anti-reflective unit may be disposed between the display panel DP and the input sensing unit TU or on the input sensing unit TU. The anti-reflective unit may reduce the reflectance of an external light incident to the display device DD. The anti-reflective unit may include a retarder, a polarizer, or a destructive interference structure. Additionally, or alternatively, the anti-reflective unit may include a color filter.

The window may be disposed on an upper surface of the display panel DP and may protect the display panel DP. For example, the window may include an optically transparent insulating material. For instance, the window may include a glass material or a plastic film. The window may have a single-layer or multi-layer structure.

FIGS. 3 to 6 are cross-sectional views showing display devices taken along a line I-I' shown in FIG. 2. The protective member PI may have a variety of shapes. FIGS. 3 to 6 show display devices DD that include substantially the same display panel DP and the same input sensing unit TU and include protective members different in structure from each other. Hereinafter, the display devices DD will be described with reference to FIGS. 3 to 6.

The display panel DP may include a base layer BS, a circuit layer CL, a pixel definition layer PDL, a display element DEM, and an encapsulation layer TFE. The display panel DP may include a plurality of light-emitting areas PXA and a non-light-emitting area NPXA surrounding the light-emitting areas PXA.

The base layer BS may include a flexible film and/or a synthetic resin film. The synthetic resin film may be, for example, a polyimide-based resin layer. However, the base layer BS should not be limited thereto or thereby and may include a plastic substrate, a glass substrate, a metal substrate, or an organic/inorganic composite material.

The circuit layer CL may be disposed on the base layer BS. The circuit layer CL may include a plurality of transistors (not shown). Each of the transistors (not shown) may include a control electrode, an input electrode, and an output electrode. For example, the circuit layer CL may include a switching transistor and a driving transistor to drive the display element DEM.

The pixel definition layer PDL may be disposed on the circuit layer CL. Openings OO may be defined through the pixel definition layer PDL. The openings OO may respectively correspond to the light-emitting areas PXA. The pixel definition layer PDL may correspond to the non-light-emitting area NPXA.

The display element DEM may be disposed on the circuit layer CL and may be disposed in each of the openings OO defined through the pixel definition layer PDL. The display element DEM may display image using the light in response to electrical signals applied thereto through the transistors (not shown) included in the circuit layer CL.

The display element DEM may include a first electrode EL1, a light-emitting layer EML, and a second electrode EL2. The display element DEM may generate the light by recombining holes and electrons, which are respectively injected through the first electrode EL1 and the second electrode EL2, in the light-emitting layer EML. Accordingly, the light-emitting areas PXA may correspond to an area in which the light-emitting layer EML is disposed.

The light-emitting areas PXA may have different sizes from each other. For example, the light-emitting areas PXA may have different sizes from each other, depending on the colors of the light emitted therefrom. As the light-emitting areas have sizes suitable for different colors, the light-emitting areas may provide uniform light efficiency with respect to various colors.

The encapsulation layer TFE may cover the display element DEM. The encapsulation layer TFE may include at least one insulating layer. The encapsulation layer TFE may be disposed between the display element DEM and the input sensing unit TU and may electrically separate the display element DEM from the input sensing unit TU.

The encapsulation layer TFE may include at least one inorganic layer or organic layer. Additionally, or alternatively, the encapsulation layer TFE may include an inorganic layer and an organic layer. The encapsulation layer TFE, according to the embodiment of the present disclosure, may include a first inorganic layer IO1, a second inorganic layer IO2, and an organic layer OL.

The first inorganic layer IO1 may be disposed on the second electrode EL2. The second inorganic layer IO2 may be disposed on the first inorganic layer IO1, and the organic layer OL may be disposed between the first and second inorganic layers IO1 and IO2. The first and second inorganic layers IO1 and IO2 may protect the display element DEM from moisture and oxygen, and the organic layer OL may protect the display element DEM from a foreign substance, such as dust particles.

The first and second inorganic layers IO1 and IO2 may include a silicon nitride layer, a silicon oxynitride layer, a silicon oxide layer, a titanium oxide layer, or an aluminum oxide layer. However, first and second inorganic layers IO1 and IO2 should not be limited thereto or thereby. The organic layer OL may include an acrylic-based organic layer, but the organic layer OL should not be limited thereto or thereby.

The input sensing unit TU may be disposed on the display panel DP. The input sensing unit TU may be disposed directly on the encapsulation layer TFE. For example, the input sensing unit TU may be formed on an upper surface of the encapsulation layer TFE by a deposition or patterning process. The display device DD may further include a member (not shown), such as a color filter or a buffer layer, interposed between the input sensing unit TU and the encapsulation layer TFE.

The input sensing unit TU may include a first conductive layer 10, an insulating layer IL, and a second conductive layer 20. The first conductive layer 10, the insulating layer IL, and the second conductive layer 20 may be sequentially disposed on the display panel DP.

The first conductive layer 10 and the second conductive layer 20 may include a plurality of conductive patterns. The conductive patterns may form the above-described sensing patterns SP1 and SP2 and the above-described connection patterns BP1 and BP2.

Figure 3:
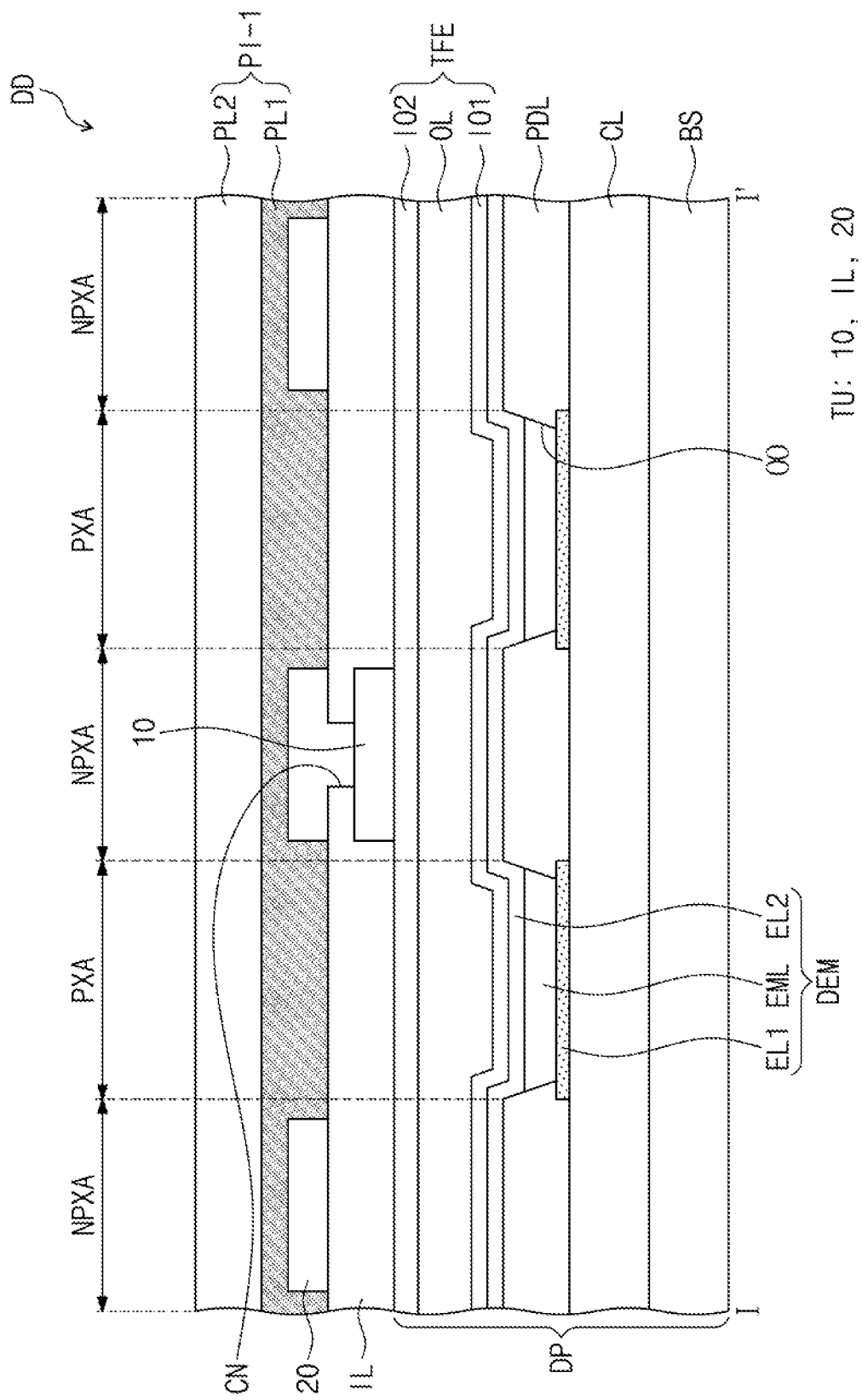
FIG. 3 is a cross-sectional view showing a display device according to an embodiment of the present disclosure.

A portion of the first conductive layer 10 may be connected to at least a portion of the second conductive layer 20. At least some of conductive patterns of the first conductive layer 10 may be connected to some of conductive patterns of the second conductive layer 20. For example, FIG. 3 shows three conductive patterns of the second conductive layer 20 and one conductive pattern of the first conductive layer 10 as a representative example. The first conductive layer 10 may be connected to one of the three conductive patterns of the second conductive layer 20 through a contact hole CN defined through the insulating layer IL.

Each of the first and second conductive layers 10 and 20 may have a single-layer structure or a multi-layer structure in which layers are stacked in the third direction DR3. The conductive layer with the single-layer structure may include a metal layer or a transparent conductive layer. The metal layer may include molybdenum, silver, titanium, copper, aluminum, and an alloy thereof. The transparent conductive layer may include a transparent conductive oxide, such as indium tin oxide (ITO), indium zinc oxide (IZO), zinc oxide (ZnO), indium tin zinc oxide (ITZO), or the like. The transparent conductive layer may include a conductive polymer, such as PEDOT, a metal nanowire, or graphene.

The conductive layer with the multi-layer structure may include a plurality of metal layers. The metal layers may have a three-layer structure of titanium/aluminum/titanium. The conductive layer with the multi-layer structure may include at least one metal layer and at least one transparent conductive layer.

The insulating layer IL may include an inorganic layer, an organic layer, or a composite material. For example, the insulating layer IL may include at least one of aluminum oxide, titanium oxide, silicon oxide, silicon oxynitride, zirconium oxide, hafnium oxide, an acrylic-based resin, a methacrylic-based resin, a polyisoprene, a vinyl-based resin, an epoxy-based resin, a urethane-based resin, a cellulose-based resin, a siloxane-based resin, a polyimide-based resin, a polyamide-based resin, and a perylene-based resin.

Although not shown in figures, the input sensing unit TU may further include a buffer layer. The buffer layer may be disposed directly on the encapsulation layer TFE of the display panel DP. The buffer layer may include an inorganic material. For example, the buffer layer may include at least one of aluminum oxide, titanium oxide, silicon oxide, silicon oxynitride, silicon nitride, zirconium oxide, and hafnium oxide. The buffer layer may include the same material as that of the inorganic layer IO2 disposed at an uppermost position of the encapsulation layer TFE. Although the buffer layer and the inorganic layer IO2 include the same material, the buffer layer and the inorganic layer IO2 may be formed under different deposition conditions.

As shown in FIG. 3, a protective member PI-1 may include a first protective portion PL1 and a second protective portion PL2. The first protective portion PL1 may be disposed on the input sensing unit TU, and the second protective portion PL2 may be disposed on the first protective portion PL1. The first protective portion PL1 may cover the input sensing unit TU. In some examples, the first protective portion PL1 is a first protective layer disposed over the input sensing unit TU and the second protective portion PL2 is in the form of a second protective layer disposed directly on the first protective portion PL1.

The first protective portion PL1 may have a first modulus, the second protective portion PL2 may have a second modulus, and the first modulus may be greater than the second modulus. For example, the second modulus may be equal to or greater than about 0.1 MPa and equal to or less than about 5.0 GPa. A value of the first modulus may be greater than a value of the second modulus.

The modulus of a protective portion may refer to a behavioral property of the protective portion when the protective portion is under pressure (e.g., under pressure from various directions). For instance, the modulus may refer to a mechanical property that measures the tensile stiffness of a solid material (e.g., of a respective protective portion). The modulus of a protective portion may refer to the ability of the protective portion to resist volumetric deformation (e.g., and/or return to original volume) due to external input TC. In some examples, modulus may be referred to in units of pascals (Pa), megapascals (MPa), gigapascals (GPa), etc. In some cases, the modulus may be referred to as an elastic modulus.

The modulus may be determined depending on a type, a structure, and a density of material included in the protective portions PL1 and PL2. The first protective portion PL1 may include an organic material with a high modulus or an organic material in which inorganic particles are dispersed. For example, the inorganic particles may be a metal material.

The first protective portion PL1 may include an organic material and fine inorganic particles. In detail, the first protective portion PL1 may include the organic material in which the inorganic particles, each with a diameter equal to or less than about 10 micrometers. Additionally, or alternatively, the first protective portion PL1 may include graphene to compensate for the modulus of an organic resin, which is relatively low.

The protective member PI-1 may protect the display panel DP and the input sensing unit TU from impacts. The first protective portion PL1 with the first modulus may be disposed at a relatively lower position in the protective member PI-1, and the second protective portion PL2 with the second modulus less than the first modulus may be disposed at a relatively upper position in the protective member PI-1, thereby improving the impact resistance of the display device DD.

The second protective portion PL2 with the relatively small modulus may absorb the impact applied to the protective member PI-1. The first protective portion PL1 with the relatively high modulus may be in contact with the second protective portion PL2 with the relatively small modulus and may disperse the impact absorbed by the second protective portion PL2. Additionally, or alternatively, when the modulus is small, deformation caused by an external force may occur. The deformation of the display panel DP and the input sensing unit TU may be prevented by the first protective portion PL1 disposed at the relatively lower position.

The protective member PI-1 may have an insulating property. Accordingly, each of the first and second protective portions PL1 and PL2 may have an insulating property.

The first and second protective portions PL1 and PL2 may include an organic material. For example, the first and second protective portions PL1 and PL2 may include at least one of an acrylic-based resin, a methacrylic-based resin, a polyisoprene, a vinyl-based resin, an epoxy-based resin, a urethane-based resin, a cellulose-based resin, a siloxane-based resin, a polyimide-based resin, polyamide-based resin, and a perylene-based resin. However, the organic material should not be limited thereby or thereto. The first and second protective portions PL1 and PL2 may include an ultraviolet-curable resin.

The first and second protective portions PL1 and PL2 may be disposed in an area that overlaps at least a portion of the pixel definition layer PDL and the light-emitting layer EML. For example, the first and second protective portions PL1 and PL2 may be disposed to overlap the light-emitting areas PXA and the non-light-emitting area NPXA. Although the first and second protective portions PL1 and PL2 overlap the light-emitting layer EML, the first and second protective portions PL1 and PL2 may not exert influence on the image IM displayed in the light-emitting areas PXA. For example, the first and second protective portions PL1 and PL2 may include an optically transparent material.

Figure 4:
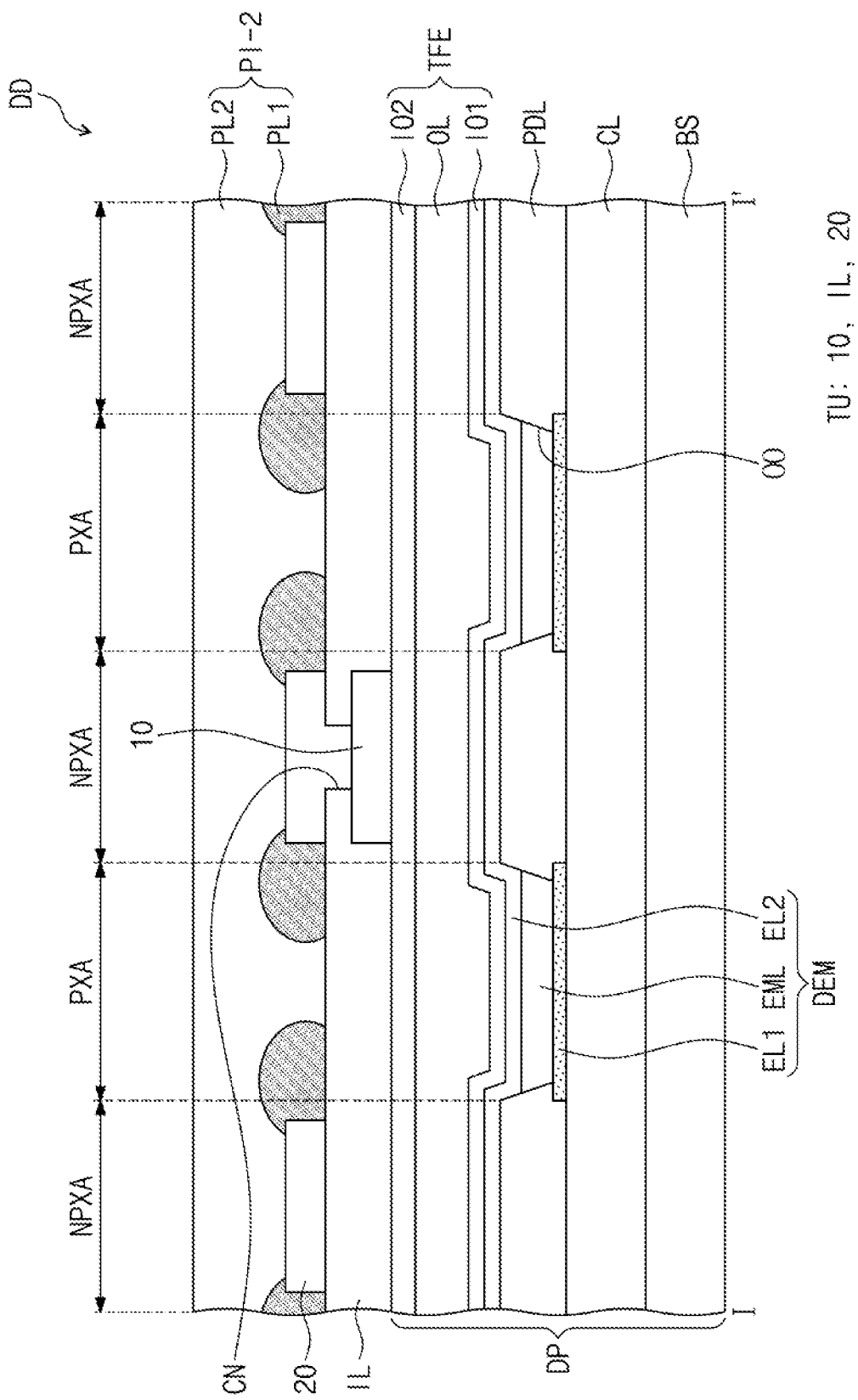
FIG. 4 is a cross-sectional view showing a display device according to an embodiment of the present disclosure.

As shown in FIG. 4, a first protective portion PL1 included in a protective member PI-2 may have a pattern shape. FIG. 4 shows a cross-section of the first protective portion PL1 with the pattern shape. A shape of the first protective portion PL1 in the cross-section, according to the present embodiment, includes a curved line. The shape of the cross-section of the first protective portion PL1 should not be limited thereto or thereby.

The first protective portion PL1 may have the pattern shape in which a plurality of bars is arranged. For example, the first protective portion PL1 may have a stripe pattern or a mesh pattern. Spaces or openings, which are spaced apart from each other, may be defined by the shape of the first protective portion PL1.

The first protective portion PL1 may expose portions of an upper surface of the input sensing unit TU. The first protective portion PL1 may be in contact with the portions of the input sensing unit TU. For example, the first protective portion PL1 may be in contact with portions of an insulating layer IL and a second conductive layer 20 of the input sensing unit TU as shown in FIG. 4. However, the first protective portion PL1 should not be limited thereto or thereby. For example, the first protective portion PL1 may be a pattern that covers the second conductive layer 20 or a pattern that covers exposed upper surface of the insulating layer IL in the input sensing unit TU.

The pattern shape of the first protective portion PL1 may overlap portions of the pixel definition layer PDL and the light-emitting layer EML. The first protective portion PL1 may transmit a light emitted from the light-emitting layer EML without significantly decreasing the transmittance of the light. For example, the first protective portion PL1 may include an optically transparent material.

A second protective portion PL2 may cover the first protective portion PL1 and the exposed upper surface of the input sensing unit TU. Accordingly, the second protective portion PL2 may cover spaces or openings, which are spaced apart from each other and defined corresponding to the shape of the first protective portion PL1, while being filled in the spaces or the openings.

As the first protective portion PL1 has the pattern shape, the first protective portion PL1 may effectively disperse the impact absorbed by the second protective portion PL2 along the pattern shape. Additionally, or alternatively, the first protective portion PL1 may support the second protective portion PL2 to prevent the second protective portion PL2 from being deformed and may not significantly decrease the flexibility of the display panel DP.

Figure 5:
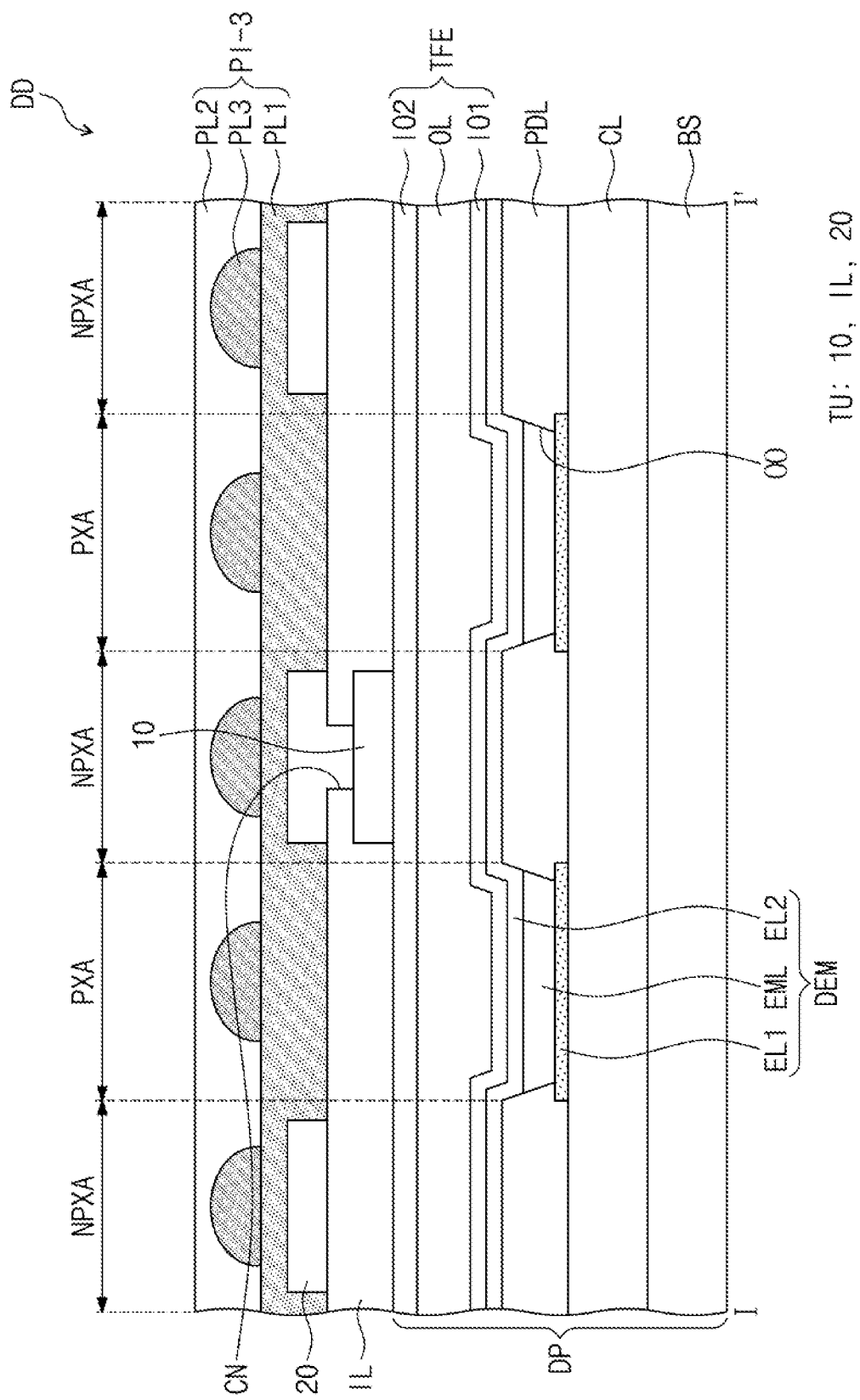
FIG. 5 is a cross-sectional view showing a display device according to an embodiment of the present disclosure.

As shown in FIG. 5, a protective member PI-3 may further include a third protective portion PL3 disposed between a first protective portion PL1 and a second protective portion PL2. The third protective portion PL3 may cover the first protective portion PL1 or may have a pattern shape as the first protective portion PL1 shown in FIG. 4.

The third protective portion PL3 may have a third modulus greater than the second modulus. The third modulus may be the same as the first modulus, but not necessarily the same.

The first protective portion PL1 and the third protective portion PL3 may have the same shape as each other or different shapes from each other. As shown in FIG. 5, the first protective portion PL1 may have a shape that covers an upper surface of the input sensing unit TU, and the third protective portion PL3 may have the pattern shape.

The third protective portion PL3 may have the pattern shape in which a plurality of bars is arranged. For example, the third protective portion PL3 may have a stripe pattern or a mesh pattern. However, the third protective portion PL3 should not be limited thereto or thereby.

Spaces or openings spaced apart from each other, may be defined in the third protective portion PL3 with the pattern shape, and portions of the first protective portion PL1 may be exposed. However, the embodiment should not be limited thereto or thereby. The first protective portion PL1 may have a pattern shape exposing a portion of the upper surface of the input sensing unit TU as shown in FIG. 4, and the third protective portion PL3 may have the same pattern shape as that of the first protective portion PL1 and may be stacked on the first protective portion PL1.

The third protective portion PL3 may include the same material as that of the first protective portion PL1. Additionally, or alternatively, the third protective portion PL3 may be integrally formed with the first protective portion PL1. However, the third protective portion PL3 should not be limited thereto or thereby. The first protective portion PL1 and the third protective portion PL3 may include different materials from each other. The first protective portion PL1 and the third protective portion PL3 may be formed through different processes from each other.

The second protective portion PL2 may cover the third protective portion PL3. Additionally, or alternatively, the second protective portion PL2 may cover the upper surface of the input sensing unit TU, which is exposed through the first and third protective portions PL1 and PL3. Accordingly, the second protective portion PL2 may cover the spaces or the openings, which are spaced apart from each other and defined corresponding to the shape of the first and third protective portions PL1 and PL3, while being filled in the spaces or openings.

As shown in FIG. 6, a protective member PI-4 may further include a fourth protective portion PL4 disposed between a first protective portion PL1 and a third protective portion PL3. The protective member PI-4 may have a structure in which the first protective portion PL1, the fourth protective portion PL4, the third protective portion PL3, and a second protective portion PL2 are sequentially stacked.

The fourth protective portion PL4 may have a modulus smaller than the first modulus and the third modulus. The modulus of the fourth protective portion PL4 may be the same as the second modulus. However, the modulus of the fourth protective portion PL4 should not be limited thereto or thereby. For example, the modulus of the fourth protective portion PL4 may be equal to or greater than about 0.1 MPa and equal to or smaller than about 5 GPa. Additionally, or alternatively, the fourth protective portion PL4 may include the same material as the second protective portion PL2. However, the fourth protective portion PL4 should not be limited thereto or thereby.

Accordingly, the protective member PI-4 may have a structure in which the protective portion with the relatively small modulus and the protective portion with the relatively high modulus are alternately stacked one on another. FIG. 6 shows four protective portions PL1, PL2, PL3, and PL4. However, the number of protective portions should not be limited to four. Two or more protective portions may be disposed between the first protective portion PL1 and the second protective portion PL2.

As shown in FIG. 6, the first to fourth protective portions PL1 to PL4 may have a layer shape. However, the first to fourth protective portions PL1 to PL4 should not be limited to the layer shape. For example, the first and third protective portions PL1 and PL3, which have relatively high modulus, may have the pattern shape as described-above.

In the protective member, according to the embodiment, as the protective portion with the relatively small modulus and the protective portion with the relatively high modulus are alternately stacked one on another, the protective portion with the relatively small modulus may absorb the impact, and the protective portion with the relatively high modulus may disperse the impact. Additionally, or alternatively, the protective portion with the relatively high modulus may cover the input sensing unit TU disposed under the protective member. Therefore, the input sensing unit TU may be prevented from being deformed and may be protected.

Additionally, or alternatively, the insulating layer IL of the input sensing unit TU may include an inorganic layer, and the inorganic layer may be lifted when being in contact with the organic layer with a small modulus. However, since the first protective portion PL1 has relatively high modulus, the lifting phenomenon may be improved.

Figure 7A:
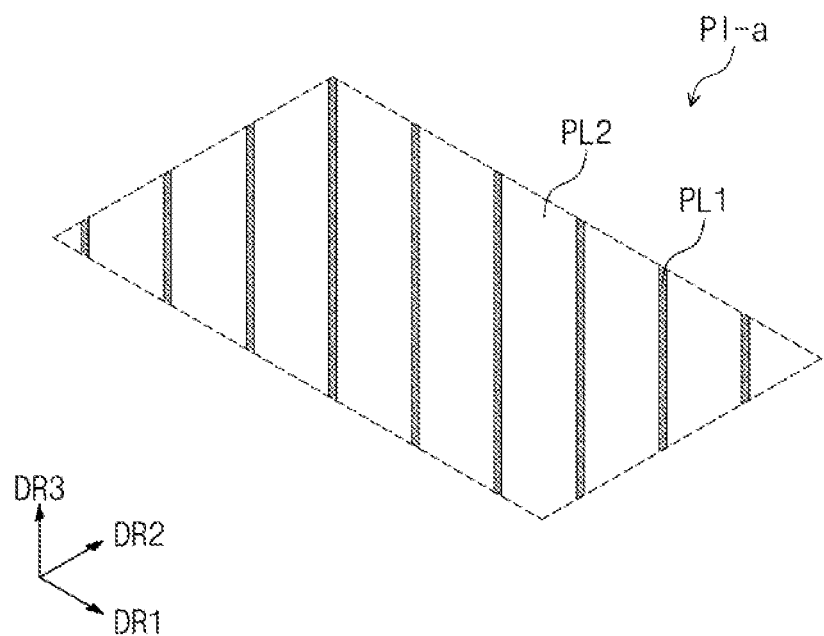
FIG. 7A is a perspective view showing a protective member according to an embodiment of the present disclosure.
Figure 7B:
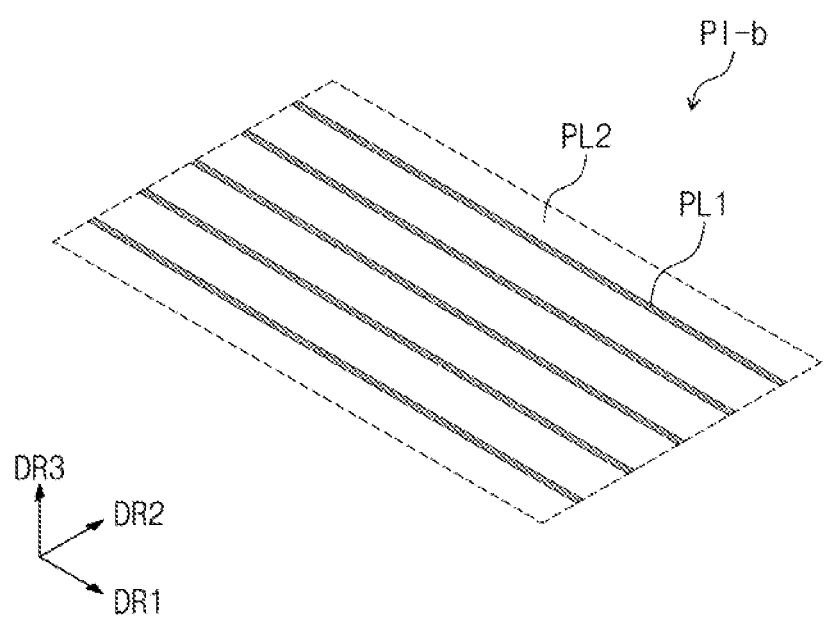
FIG. 7B is a perspective view showing a protective member according to an embodiment of the present disclosure.
Figure 7C:
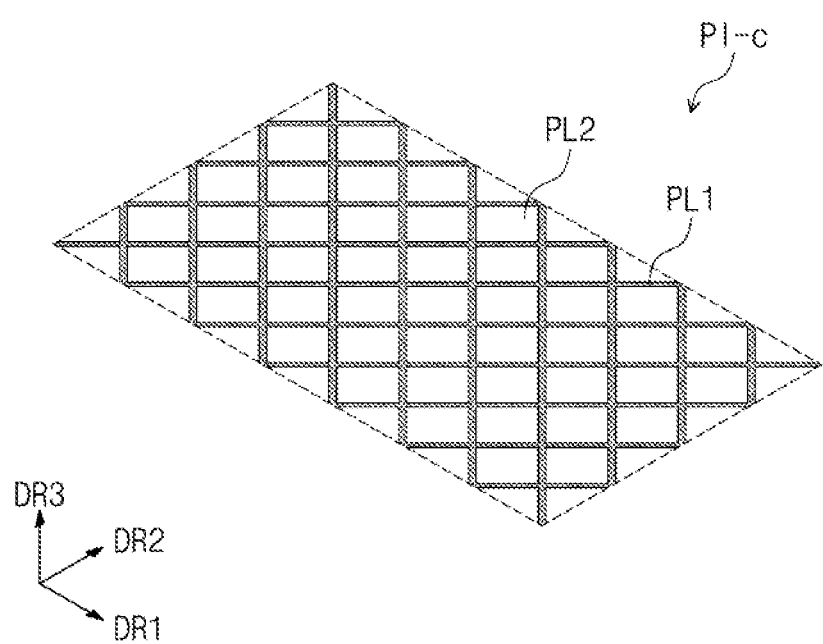
FIG. 7C is a perspective view showing a protective member according to an embodiment of the present disclosure.

FIGS. 7A to 7C are perspective views showing protective members PI-a, PI-b, and PI-c, according to embodiments of the present disclosure. FIGS. 7A to 7C are perspective views showing areas of the protective members PI-a, PI-b, and PI-c with a first protective portion PL1 with a pattern shape. The protective member should not be limited to pattern shapes shown in FIGS. 7A to 7C and may include a variety of pattern shapes.

Referring to FIGS. 7A and 7B, the first protective portion PL1 may have the pattern shape in which multiple bars extend in one direction and are spaced apart from each other and. For example, the first protective portion PL1 may have a stripe pattern. Spaces between the bars may be filled with a second protective portion PL2.

A direction in which the bars extend and a direction in which the bars are arranged in the first protective portion PL1 of FIG. 7A are different from those in the first protective portion PL1 of FIG. 7B. However, the extension direction and the arrangement direction of the bars should not be limited thereto or thereby, and different from the above-described embodiments, some or all the bars are not necessarily extended or arranged in the same direction.

The bars of the pattern shape of the first protective portion PL1 may be spaced apart from each other at regular intervals. However, the bars of the pattern shape of the first protective portion PL1 should not be limited thereto or thereby. The first protective portion PL1 may have a pattern shape in which the bars are arranged at irregular intervals but are arranged according to a certain rule.

Referring to FIG. 7C, the first protective portion PL1 may have a pattern shape in which multiple bars extend in different directions from each other to cross each other. For example, the first protective portion PL1 may have a mesh pattern. Openings may be defined in the first protective portion PL due to the shapes of the bars arranged to cross each other. The openings may be filled with the second protective portion PL2.

The directions in which the bars with the mesh pattern are arranged should not be limited to directions shown in FIG. 7C. Additionally, or alternatively, referring to FIG. 7C, the openings defined by the pattern shape of the first protective portion PL1 may have a lozenge shape, however, the shape of the openings should not be limited thereto or thereby. For example, the openings may have a polygonal shape or a rectangular shape. The openings defined by the pattern shape of the first protective portion PL1 may have the same size as each other. However, the openings defined by the pattern shape of the first protective portion PL1 should not be limited thereto or thereby. For example, the first protective portion PL1 may have the pattern shape in which the openings have different sizes from each other but are arranged with regularity.

Although the second protective portion is not shown in FIGS. 7A to 7C to show the pattern shape of the first protective portion PL1, the second protective portion PL2 may be disposed on the first protective portion PL1 and may cover an upper surface of the first protective portion PL1.

FIGS. 7A to 7C show representative examples of the pattern shape of the first protective portion PL1. However, the pattern shape of the first protective portion PL1 should not be limited to those shown in FIGS. 7A to 7C. For example, the first protective portion PL1 may have the pattern shape in which the bars are arranged in a repeatable manner.

Figure 8:
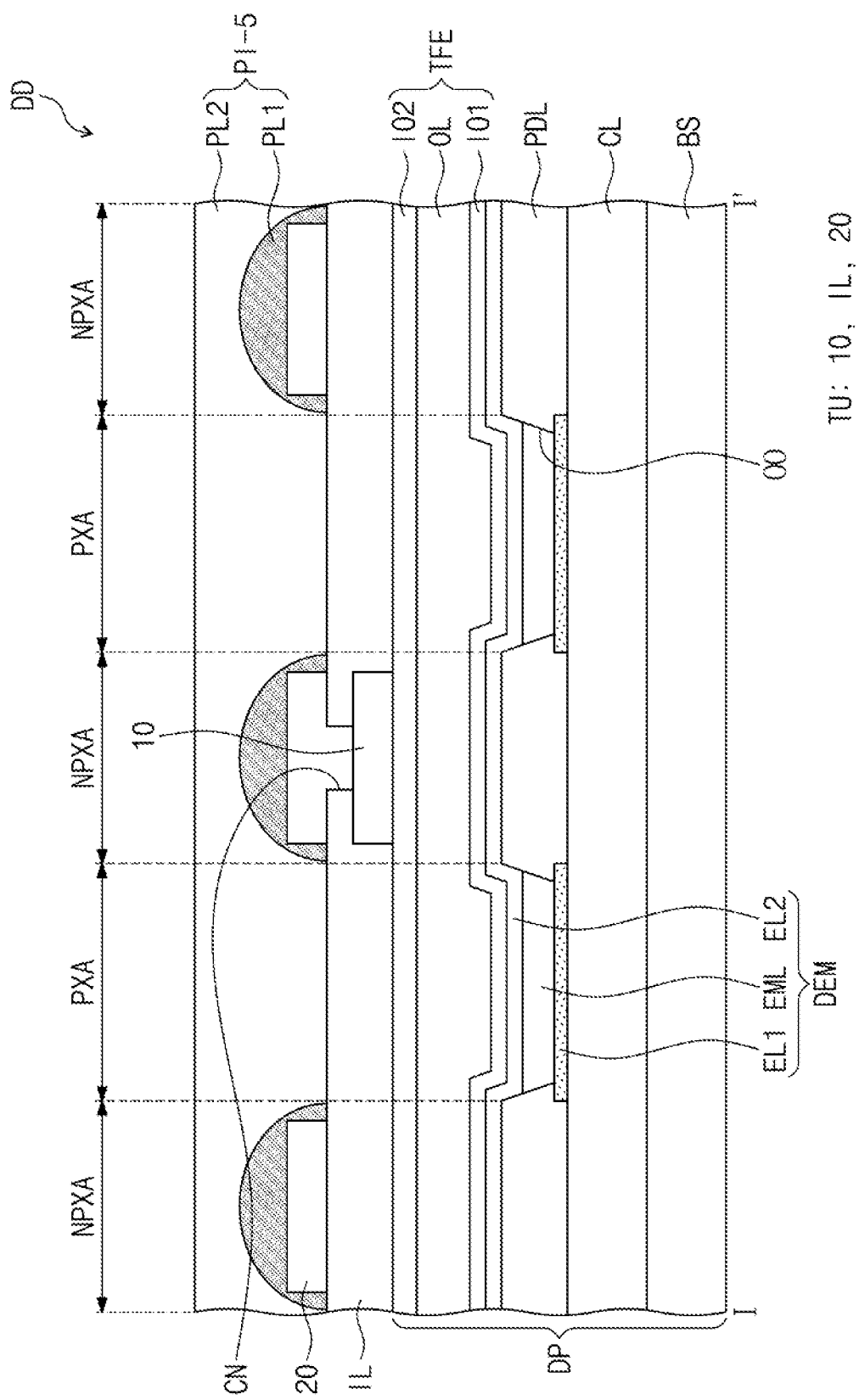
FIG. 8 is a cross-sectional view showing a display device according to an embodiment of the present disclosure.
Figure 9:
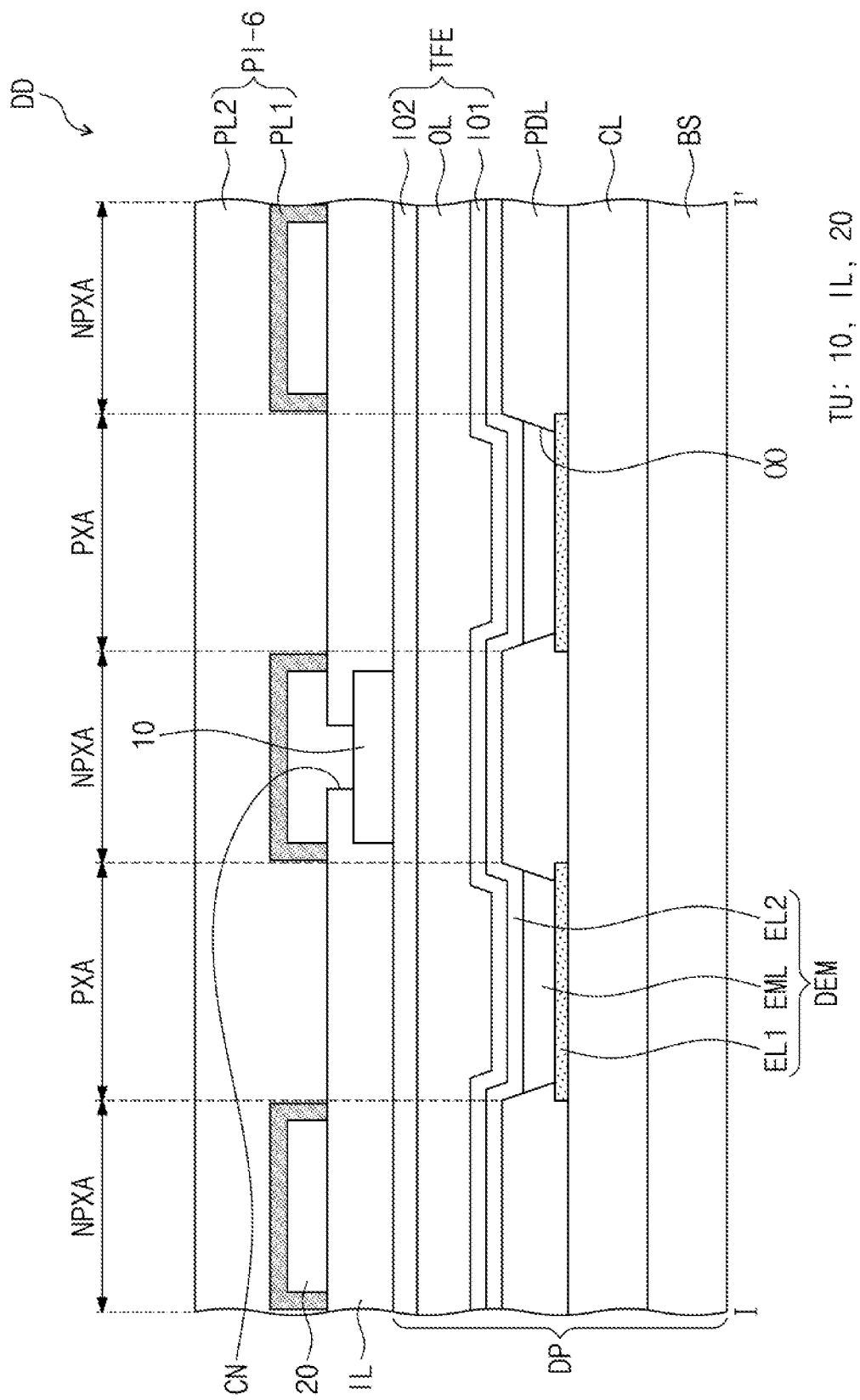
FIG. 9 is a cross-sectional view showing a display device according to an embodiment of the present disclosure.

FIGS. 8 and 9 are cross-sectional views showing display devices DD according to embodiments of the present disclosure. The display devices DD shown in FIGS. 8 and 9 may include substantially the same display panel DP and the same input sensing unit TU, and details of the display panel DP and the input sensing unit TU described with reference to FIGS. 3 to 6 may be applied to the display panel DP and the input sensing unit TU shown in FIGS. 8 and 9. Protective members PI-5 and PI-6, to be described with reference to FIGS. 8 and 9, will mainly focus on differences from the above-described protective members.

As shown in FIGS. 8 and 9, a first protective portion PL1 included in the protective member PI-5 may have a pattern shape, and a second protective portion PL2 may cover the first protective portion PL1 and an input sensing unit TU whose upper surface is exposed. The modulus relationship between the first protective portion PL1 and the second protective portion PL2 is as described above.

The first protective portion PL1 shown in FIGS. 8 and 9 may overlap a pixel definition layer PDL and may not overlap a light-emitting layer EML. Accordingly, the first protective portion PL1 may overlap a non-light-emitting area NPXA corresponding to the pixel definition layer PDL and may not overlap light-emitting areas PXA corresponding to the light-emitting layer EML.

Although the first protective portion PL1 that does not overlap the light-emitting areas PXA is formed of an opaque material or has a wide area, the first protective portion PL1 may not exert influence on a light emitted from the light-emitting areas PXA and an image IM displayed by the light.

Accordingly, the first protective portion PL1 that does not overlap the light-emitting areas PXA may include a light-blocking material. For example, the light-blocking material may include a black pigment or a black dye. However, the color of the light-blocking material should not be limited to the black color, and the light-blocking material may include a pigment or dye of another color with a light-blocking property.

Referring to FIG. 8, the first protective portion PL1 may have a shape with a curve in a cross-section. The first protective portion PL1 may have a pattern formed by an inkjet printing method, and the first protective portion PL1 formed by the inkjet printing method may have a semi-circular shape in the cross-section.

Referring to FIG. 9, the first protective portion PL1 may have a shape like a U-shaped bracket in the cross-section. The first protective portion PL1 may have a pattern formed by a photolithography method. Therefore, an end of the first protective portion PL1 may have an angle close to 90 degrees. However, the shape in the cross-section of the first protective portion PL1 should not be limited to those shown in FIGS. 8 and 9.

FIG. 10 is a plan view showing a protective member PI-5 according to an embodiment of the present disclosure. For the convenience of explanation, light-emitting areas PXA-R, PXA-G, and PXA-B and a non-light-emitting area NPXA of a display panel according to an embodiment are shown in FIG. 10.

FIG. 10 shows the light-emitting areas PXA-R, PXA-G, and PXA-B with different sizes from each other as a representative example. The light-emitting areas PXA-R, PXA-G, and PXA-B may have different sizes from each other depending on the colors of lights emitted therefrom. The non-light-emitting area NPXA may surround the light-emitting areas PXA-R, PXA-G, and PXA-B.

A first protective portion PL1 included in the protective member PI-5, according to the embodiment may have a pattern shape that overlaps the non-light-emitting area NPXA and does not overlap the light-emitting areas PXA-R, PXA-G, and PXA-B. However, the pattern shape of the first protective portion PL1 should not be limited thereto or thereby, and the first protective portion PL1 may have a pattern shape that overlaps a portion of the light-emitting areas PXA-R, PXA-G, and PXA-B or an entire portion of the light-emitting areas PXA-R, PXA-G, and PXA-B.

Referring to FIG. 10, the pattern shape of the first protective portion PL1 may be a mesh pattern defined by a plurality of bars extending in a fourth direction DR4 and a plurality of bars extending in a fifth direction DR5 and crossing the bars extending in the fourth direction DR4. A plurality of openings OP1, OP2, and OP3 may be defined by the pattern shape of the first protective portion PL1, which is defined by the bars crossing each other.

The openings OP1, OP2, and OP3 may have sizes different from each other. The openings OP1, OP2, and OP3 may overlap the light-emitting areas PXA-R, PXA-G, and PXA-B, respectively. Accordingly, the first protective portion PL1 may have a pattern shape that does not overlap the light-emitting areas PXA-R, PXA-G, and PXA-B.

FIG. 10 shows the structure in which the first protective portion PL1 overlaps the portion of the non-light-emitting area NPXA. However, the structure in which the first protective portion PL1 overlaps the portion of the non-light-emitting area NPXA should not be limited thereto or thereby. The first protective portion PL1 may overlap the entire portion of the non-light-emitting area NPXA.

FIGS. 11A to 11E are cross-sectional views showing a method of manufacturing the display device according to an embodiment of the present disclosure. FIGS. 11A to 11E sequentially show a process of forming the first protective portion PL1 and the second protective portion PL2.

The manufacturing method of the display device may include providing the display panel, providing the input sensing unit on the display panel (51 of FIG. 11A), forming the first protective portion with the first modulus on the input sensing unit (S2 of FIG. 11B, S3 of FIG. 11C), and forming the second protective portion with the second modulus on the first protective portion (S4 of FIG. 11D, S5 of FIG. 11E), and the first modulus may be greater than the second modulus.

Figure 11A:
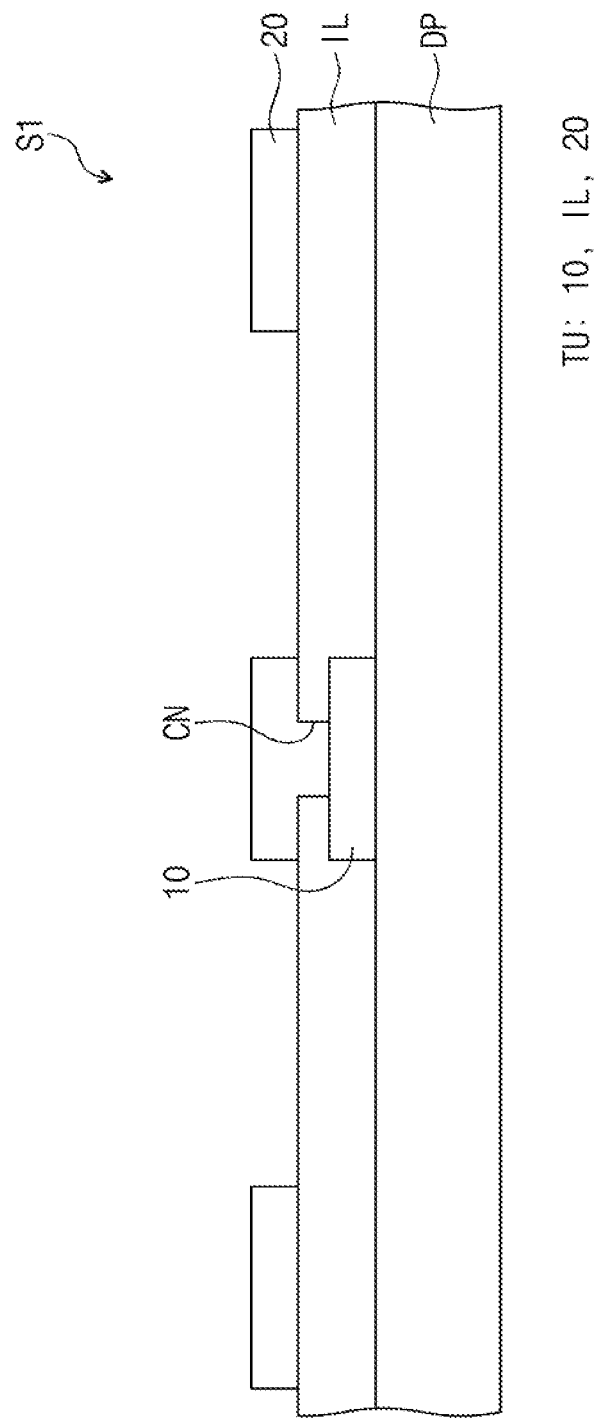
FIG. 11A is a cross-sectional view showing a process of a method of manufacturing a display device according to an embodiment of the present disclosure.

FIG. 11A shows a state in which the display panel DP is provided and the input sensing unit TU is provided on the display panel DP. Descriptions on the display panel DP and the input sensing unit TU provided by the manufacturing method of the display device are the same as the above-mentioned descriptions on the display panel DP and the input sensing unit TU.

Figure 11B:
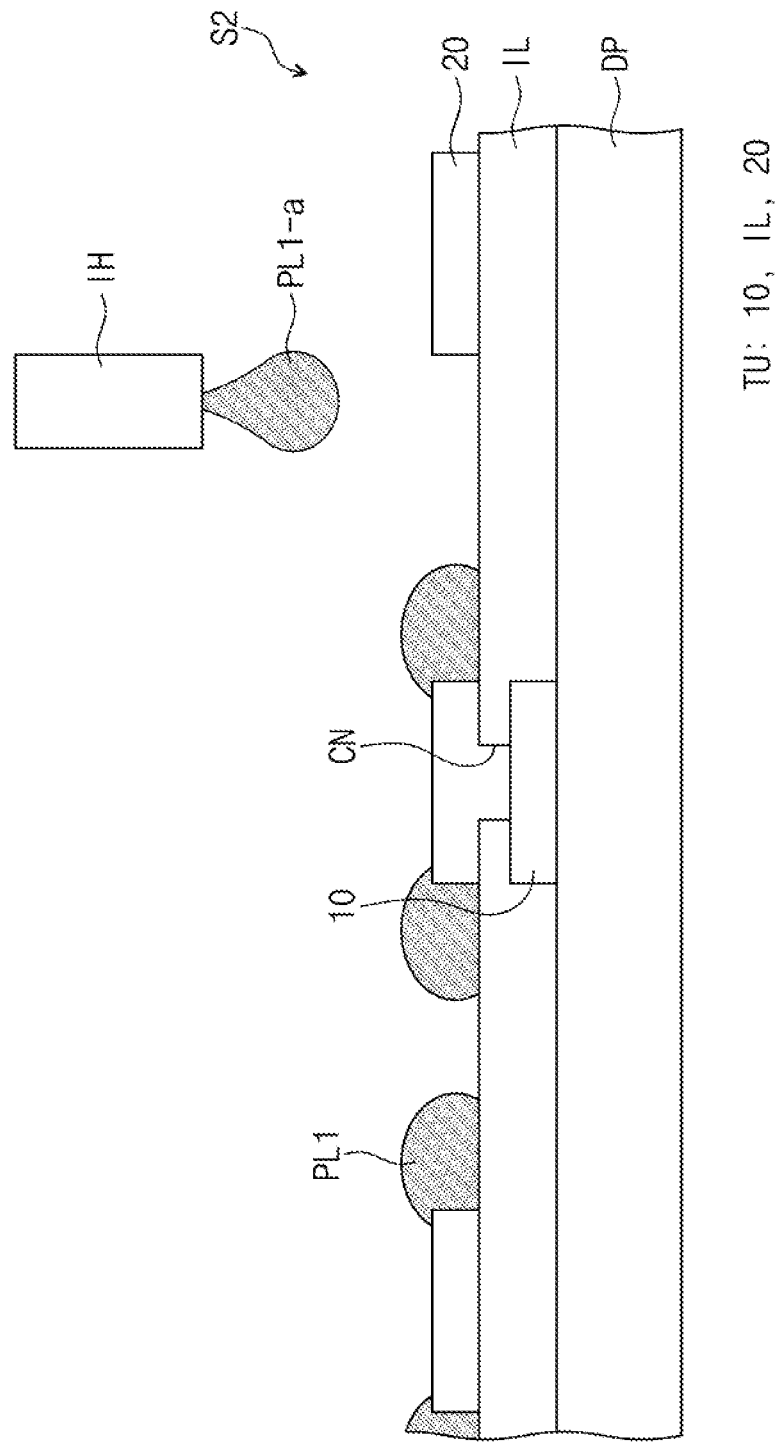
FIG. 11B is a cross-sectional view showing a process of the method of manufacturing the display device according to an embodiment of the present disclosure.
Figure 11C:
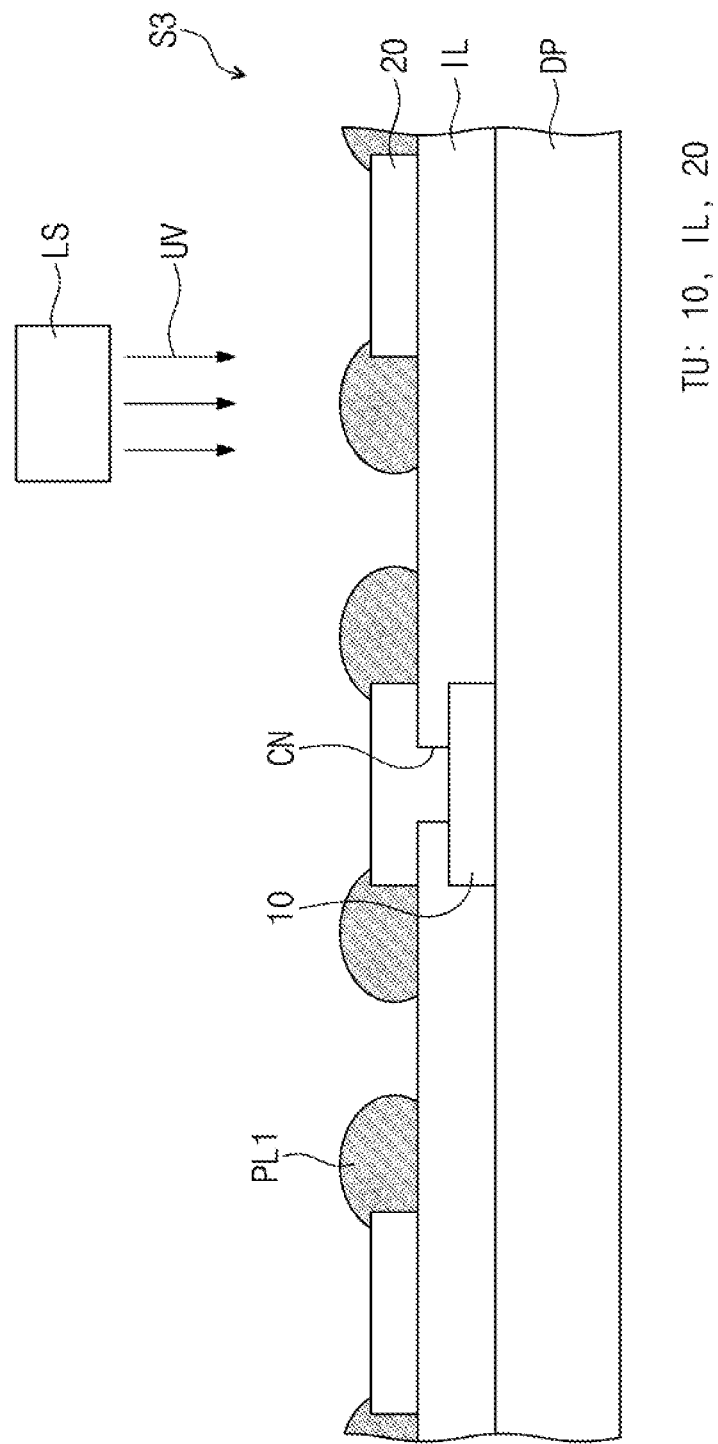
FIG. 11C is a cross-sectional view showing a process of the method of manufacturing the display device according to an embodiment of the present disclosure.

FIGS. 11B and 11C show a process of forming the first protective portion PL1 on the input sensing unit TU. FIG. 11B shows a process of patterning the first protective portion PL1. However, the patterning process may be omitted according to the shape of the first protective portion PL1.

Referring to FIG. 11B, the forming of the first protective portion PL1 may include the inkjet printing process. A first composition PL1-*a* may be sprayed onto the input sensing unit TU through an inkjet head IH to form the first protective portion PL1. The first composition PL1-*a* may be selectively sprayed onto areas in which the first protective portion PL1 is to be formed by the inkjet printing process. Accordingly, the first protective portion PL1 with the pattern shape may be formed by the inkjet printing process. When the process of forming the first protective portion PL1 with the pattern shape includes the inkjet printing process, an upper surface of the first protective portion PL1 may have a curved surface.

The process of forming the first protective portion PL1 with the pattern shape may include a photolithography process. However, when the pattern is formed through the inkjet printing process, the manufacturing method may be simplified.

FIG. 11C shows a process of irradiating an ultraviolet light UV onto the first composition PL1-a, which is sprayed onto the input sensing unit TU, using a light source LS. The first composition PL1-a may be cured by the ultraviolet light UV irradiated thereto, and the first protective portion PL1 may be formed. The first composition PL1-a used to form the first protective portion PL1 may include an ultraviolet-curable resin.

The first composition PL1-a used to form the first protective portion PL1 may include an inorganic material and an organic material. The first composition PL1-a may include a material obtained by mixing fine inorganic particles with an organic resin. As an example, the first composition PL1-a may include the material obtained by mixing fine metal particles with the organic resin. Additionally, or alternatively, the first composition PL1-a may include graphene.

Figure 11D:
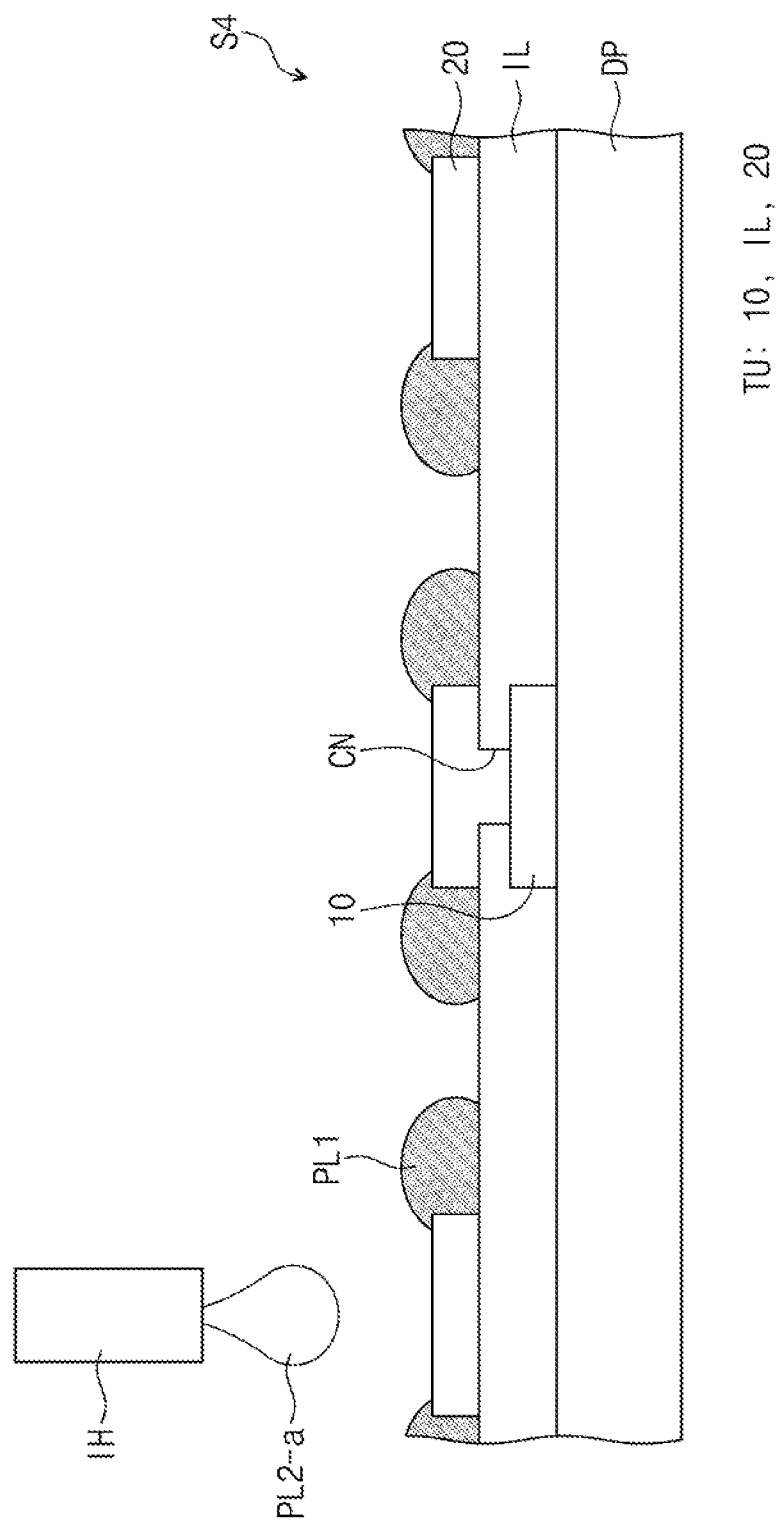
FIG. 11D is a cross-sectional view showing a process of the method of manufacturing the display device according to an embodiment of the present disclosure.
Figure 11E:
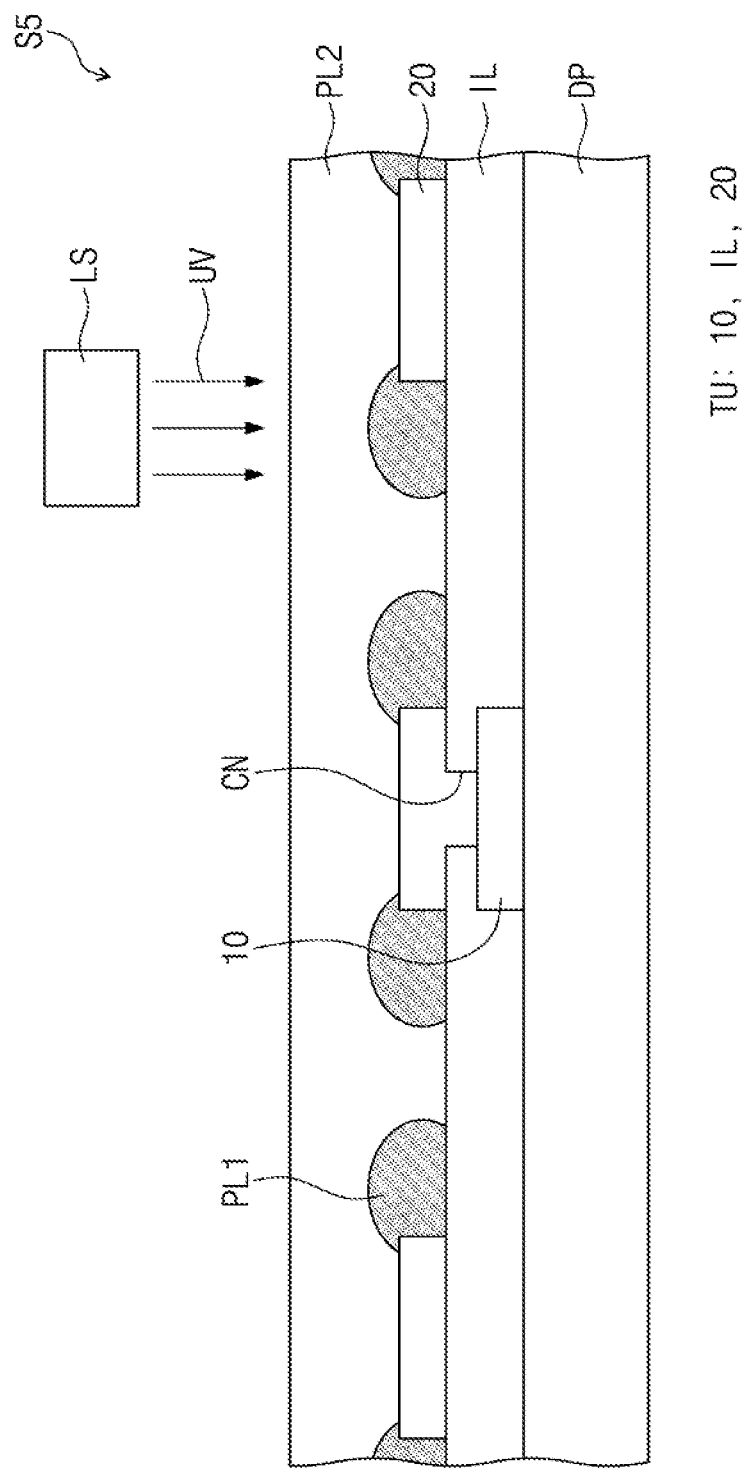
FIG. 11E is a cross-sectional view showing a process of the method of manufacturing the display device according to an embodiment of the present disclosure.

FIGS. 11D and 11E show a process of forming the second protective portion PL2 on the first protective portion PL1. The second protective portion PL2 may be formed to cover the first protective portion PL1 and the upper surface of the input sensing unit TU.

Referring to FIG. 11D, the process of forming the second protective portion PL2 may include an inkjet printing process. A second composition PL2-a used to form the second protective portion PL2 may be sprayed onto the first protective portion PL1 through the inkjet head IH. Since portions of the upper surface of the input sensing unit TU are exposed depending on the shape of the first protective portion PL1, the second composition PL2-a may be sprayed to cover the first protective portion PL1 and the exposed surface of the input sensing unit TU.

FIG. 11E shows a process of irradiating the ultraviolet light UV onto the second composition PL2-a, which is sprayed on the first protective portion PL1, using the light source LS. The second composition PL2-a may be cured by the ultraviolet light UV irradiated thereto. Therefore, the second protective portion PL2 may be formed. The second composition PL2-a used to form the second protective portion PL2 may include the ultraviolet-curable resin.

When the process of forming the second protective portion PL2 includes the process of spraying the second composition PL2-a through the inkjet printing process, the angle of the end of the second protective portion PL2 may be equal to or smaller than about 90 degrees. In detail, the angle of the end of the second protective portion PL2 may be equal to or smaller than about 50 degrees. However, the angle of the end of the second protective portion PL2 should not be limited to the above-mentioned angle.

FIG. 12A shows a process of forming the first protective portion PL1 (S6-1). FIG. 12B shows a process of forming the second protective portion PL2 (S6-2).

Referring to FIG. 12A, an inkjet head IH according to the embodiment may include a nozzle spraying a composition and a light source irradiating a light. Accordingly, the process of forming the first protective portion PL1 may include an inkjet printing process and a process of irradiating an ultraviolet light UV, and the inkjet printing process and the process of irradiating the ultraviolet light UV may be substantially simultaneously performed. The first protective portion PL1 with the pattern shape or the integral shape may be formed through the inkjet printing process and the process of irradiating the ultraviolet light UV.

Referring to FIG. 12B, the process of forming the second protective portion PL2 may include an inkjet printing process and a process of irradiating an ultraviolet light UV, and the inkjet printing process and the irradiating process of the ultraviolet light UV may be substantially simultaneously performed. An angle of an end of the second protective portion PL2 formed through the inkjet printing process and the process of irradiating the ultraviolet light UV may be equal to or smaller than about 90 degrees. In detail, the angle of the end of the second protective portion PL2 may be equal to or smaller than about 50 degrees. However, the angle of the end of the second protective portion PL2 should not be limited to the above-mentioned angle.

When the inkjet printing process and the process of irradiating the ultraviolet light UV are substantially simultaneously performed, the composition sprayed through the inkjet printing method may be prevented from being dispersed, and the protective portion with the pattern shape may be accurately formed. Additionally, or alternatively, the manufacturing method may be simplified.

The first protective portion PL1 formed through the methods shown in FIGS. 11B, 11C, and 12A may be formed to overlap at least a portion of the light-emitting areas PXA of the display panel DP.

FIG. 13 shows a process of patterning the first protective portion PL1 such that the first protective portion PL1 does not overlap the light-emitting areas PXA. The process of patterning may include an inkjet printing process. A first composition PL1-a may be sprayed onto areas in which the first protective portion PL1 is to be formed through the inkjet printing process. Therefore, the first protective portion with the pattern shape that does not overlap the light-emitting areas PXA may be formed.

The display device may include the protective member with different moduli from each other and disposed on the input sensing unit. Therefore, the impact resistance of the display device may be improved. The protective portion disposed at the upper portion of the protective member and with the low modulus may absorb the impact applied to the display device. The protective portion with the high modulus may be in contact with the protective portion with the low modulus and may disperse the absorbed impact. Therefore, the display device may be prevented from being deformed by the external impact.

According to a manufacturing method of the display device, the protective portions with different modulus may be formed on the input sensing unit. Therefore, the impact resistance of the display device may be improved. Each protective portion may be formed through the inkjet printing process and the ultraviolet curing process. Additionally, or alternatively, as the inkjet printing process and the ultraviolet curing process are substantially simultaneously performed, the protective portion may be accurately formed and may be prevented from being dispersed. Additionally, or alternatively, the protective portion with the high modulus may be formed to have the pattern shape or integral shape. As an example, the pattern of the protective portion may be formed not to overlap the light-emitting areas of the display device.

Although the embodiments of the present disclosure have been described, it is understood that the present disclosure should not be limited to these embodiments but various changes and modifications can be made by one ordinary skilled in the art within the spirit and scope of the present disclosure as hereinafter claimed.

Therefore, the disclosed subject matter should not be limited to any single embodiment described herein, and the scope of the present inventive concept shall be determined according to the attached claims.

What is claimed is:

1. A display device comprising:
   a display panel;
   an input sensing unit disposed on the display panel; and
   a protective member disposed on the input sensing unit, wherein the protective member comprises an insulating material, the protective member comprising:
      a first protective portion with a first modulus; and
      a second protective portion with a second modulus, wherein the second protective portion is disposed on the first protective portion, and
      wherein the first modulus is greater than the second modulus and the first protective portion contains a material different from a material contained in the second protective portion.

2. The display device of claim 1, wherein the first protective portion comprises a stripe pattern.

3. The display device of claim 1, wherein the first protective portion comprises a mesh pattern.

4. The display device of claim 1, wherein the first protective portion comprises an integral shape that covers an upper surface of the input sensing unit.

5. The display device of claim 1, wherein the protective member further comprises a third protective portion with a third modulus, wherein the third protective portion is disposed between the first protective portion and the second protective portion, and wherein the third modulus is greater than the second modulus.

6. The display device of claim 5, wherein the third protective portion comprises a pattern shape with a plurality of arranged bars.

7. The display device of claim 5, wherein the protective member further comprises a fourth protective portion with a fourth modulus, wherein the fourth protective portion is disposed between the first protective portion and the third protective portion, and wherein the fourth modulus is less than the first modulus and the third modulus.

8. The display device of claim 1, wherein the display panel comprises:
   a base layer;
   a circuit layer disposed on the base layer;
   an encapsulation layer disposed on the circuit layer;
   a pixel definition layer disposed between the circuit layer and the encapsulation layer, wherein the pixel definition layer comprises an opening; and
   a light-emitting layer disposed in the opening, wherein the first protective portion overlaps at least a portion of the pixel definition layer or the light-emitting layer.

9. The display device of claim 8, wherein the first protective portion does not overlap the light-emitting layer and the first protective portion comprises a light-blocking material.

10. The display device of claim 8, wherein the input sensing unit comprises:
    a first conductive layer disposed directly on the encapsulation layer;
    a second conductive layer disposed on the first conductive layer; and
    the insulating layer disposed between the first conductive layer and the second conductive layer.

11. The display device of claim 1, wherein each of the first protective portion and the second protective portion comprises an ultraviolet-curable resin.

12. The display device of claim 1, wherein the first protective portion comprises an organic material comprising inorganic particles, each inorganic particle comprising a diameter equal to or less than 10 micrometers.

13. The display device of claim 1, wherein the first protective portion comprises graphene.

14. The display device of claim 1, wherein the second modulus is equal to or greater than 0.1 MPa and the second modulus is equal to or less than 5 GPa.

15. A method of manufacturing a display device, comprising:
    providing a display panel comprising a light-emitting area and a non-light-emitting area;
    providing an input sensing unit on the display panel;
    forming a first protective portion with a first modulus on the input sensing unit; and
    forming a second protective portion with a second modulus on the first protective portion, wherein the first modulus is greater than the second modulus, and wherein the first protective portion contains a material different from a material contained in the second protective portion.

16. The method of claim 15, wherein the forming of the first protective portion or the forming of the second protective portion comprises an inkjet printing process and a process of irradiating an ultraviolet light.

17. The method of claim 16, wherein the inkjet printing process and the process of irradiating the ultraviolet light are performed substantially simultaneously.

18. The method of claim 17, wherein the forming of the first protective portion comprises forming a pattern that overlaps at least a portion of the light-emitting area and the non-light-emitting area.

19. The method of claim 17, wherein the forming of the first protective portion comprises forming a pattern that does not overlap the light-emitting area.

20. A display device comprising:
    a flexible display panel including an active area that displays an image;
    a first protective layer disposed on the display panel, wherein the first protective layer has a first elastic modulus; and
    a second protective layer disposed on the first protective layer, wherein the second protective layer overlaps an entire area of the active area and the second protective layer has a second elastic modulus that is lower than the first elastic modulus, and wherein the first protective layer contains a material different from a material contained in the second protective laver.

* * * * *